United States Patent
Grangetto et al.

(10) Patent No.: US 11,432,012 B2
(45) Date of Patent: Aug. 30, 2022

(54) METHOD AND APPARATUS FOR ENCODING AND DECODING DIGITAL IMAGES OR VIDEO STREAMS

(71) Applicant: SISVEL TECHNOLOGY S.R.L., None (IT)

(72) Inventors: Marco Grangetto, Pinerolo (IT); Francesco Verdoja, Helsinki (FI)

(73) Assignee: Sisvel Technology S.R.L., None (IT)

( * ) Notice: Subject to any disclaimer, the term of this patent is extended or adjusted under 35 U.S.C. 154(b) by 15 days.

(21) Appl. No.: 16/488,851

(22) PCT Filed: Mar. 2, 2018

(86) PCT No.: PCT/IB2018/051333
§ 371 (c)(1),
(2) Date: Aug. 26, 2019

(87) PCT Pub. No.: WO2018/158735
PCT Pub. Date: Sep. 7, 2018

(65) Prior Publication Data
US 2020/0014955 A1    Jan. 9, 2020

(30) Foreign Application Priority Data

Mar. 3, 2017   (IT) .................. 102017000024294

(51) Int. Cl.
*H04N 19/61*    (2014.01)
*H04N 19/124*    (2014.01)
(Continued)

(52) U.S. Cl.
CPC .......... *H04N 19/61* (2014.11); *H04N 19/124* (2014.11); *H04N 19/176* (2014.11); *H04N 19/45* (2014.11); *H04N 19/91* (2014.11)

(58) Field of Classification Search
None
See application file for complete search history.

(56) References Cited

U.S. PATENT DOCUMENTS

| | | | |
|---|---|---|---|
| 2005/0207497 A1* | 9/2005 | Rovati | H04N 19/436 375/240.12 |
| 2011/0206288 A1 | 8/2011 | Lee et al. | |
| 2015/0156486 A1* | 6/2015 | Miyoshi | H04N 19/11 375/240.02 |

FOREIGN PATENT DOCUMENTS

EP    2 360 927 A2    8/2011

OTHER PUBLICATIONS

International Search Report dated Jun. 7, 2018, issued in PCT Application No. PCT/IB2018/051333, filed Mar. 2, 2018.
(Continued)

*Primary Examiner* — Mikhail Itskovich
(74) *Attorney, Agent, or Firm* — Workman Nydegger

(57) ABSTRACT

A method for encoding digital images or video streams, includes a receiving phase, wherein a portion of an image is received; a graph weights prediction phase, wherein the elements of a weights matrix associated to the graph related to the blocks of the image (predicted blocks) are predicted on the basis of reconstructed, de-quantized and inverse-transformed pixel values of at least one previously coded block (predictor block) of the image, the weights matrix being a matrix comprising elements denoting the level of similarity between a pair of pixels composing said image, a graph transform computation phase, wherein the graph Fourier transform of the blocks of the image is performed, obtaining for the blocks a set of coefficients determined on the basis of the predicted weights; a coefficients quantization phase, wherein the coefficients are quantized an output phase wherein a bitstream comprising the transformed and quantized coefficients is transmitted and/or stored.

22 Claims, 13 Drawing Sheets

(51) Int. Cl.
*H04N 19/176* (2014.01)
*H04N 19/91* (2014.01)
*H04N 19/44* (2014.01)

(56) References Cited

OTHER PUBLICATIONS

Written Opinion dated Jun. 7, 2018, issued in PCT Application No. PCT/IB2018/051333, filed Mar. 2, 2018.
Sunil K. Narang et al., *Critically Sampled Graph-based Wavelet Transforms for Image Coding*, 2013 Asia-Pacific Signal and Information Processing Associate Annual Summit and Conference, Oct. 20, 2013, pp. 4.
David I. Shuman, et al., *The Emerging Field of Signal Processing on Graphs, Extending High-Dimensional Data Analysis to Networks and Other Irregular Domains*, IEEE Signal Processing Magazine, IEEE Service Center, vol. 30, No. 3, May 2013, pp. 83-98.
G. Taubin, *A Signal Processing Approach to Fair Surface Design*, Siggraph 95 Conference Proceedings, Aug. 6-11, 1995, pp. 8.
Aliaksei Sandryhaila et al., *Nearest-neighbor Image Model*, Image Processing (ICIP), 2012 19th IEEE International Conference, Sep. 30, 2012, pp. 2521-2524.
G. Shen et al., *Edge-Adaptive Transforms for Efficient Depth Map Coding*, Picture Coding Symposium 2010, Dec. 8, 2010, pp. 4.
Woo-Shik Kim et al., *Graph Based Transforms for Depth Video Coding*, IEEE 2012, pp. 813-816.
Giulia Fracastoro et al., *Predictive Graph Construction for Image Compression*, 2015 IEEE International Conference on Image Processing, Sep. 2015, pp. 2204-2208.
Wei Hu et al., *Multiresolution Graph Fourier Transform for Compression of Piecewise Smooth Images*, IEEE Transactions on Image Processing, vol. 24, No. 1, Jan. 2015, pp. 419-433.
Wei Hu et al., *Intra-Prediction and Generalized Graph Fourier Transform for Image Coding*, IEEE Signal Processing Letters, vol. 22, No. 11, Nov. 2015, pp. 1913-1917.
Jingning Han et al., *Jointly Optimized Spatial Prediction and Block Transform for Video and Image Cording*, IEEE Transactions on Image Processing, vol. 21 No. 4, Apr. 2012, pp. 1874-1884.
International Preliminary Report on Patentability dated Sep. 3, 2019, issued in PCT Application No. PCT/IB2018/051333, filed Mar. 2, 2018.

* cited by examiner

(a)
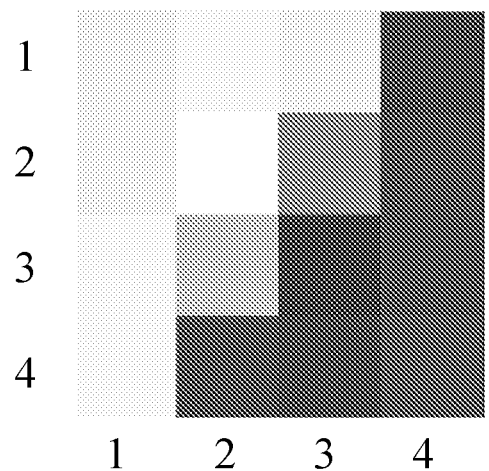
(b)
Fig. 5

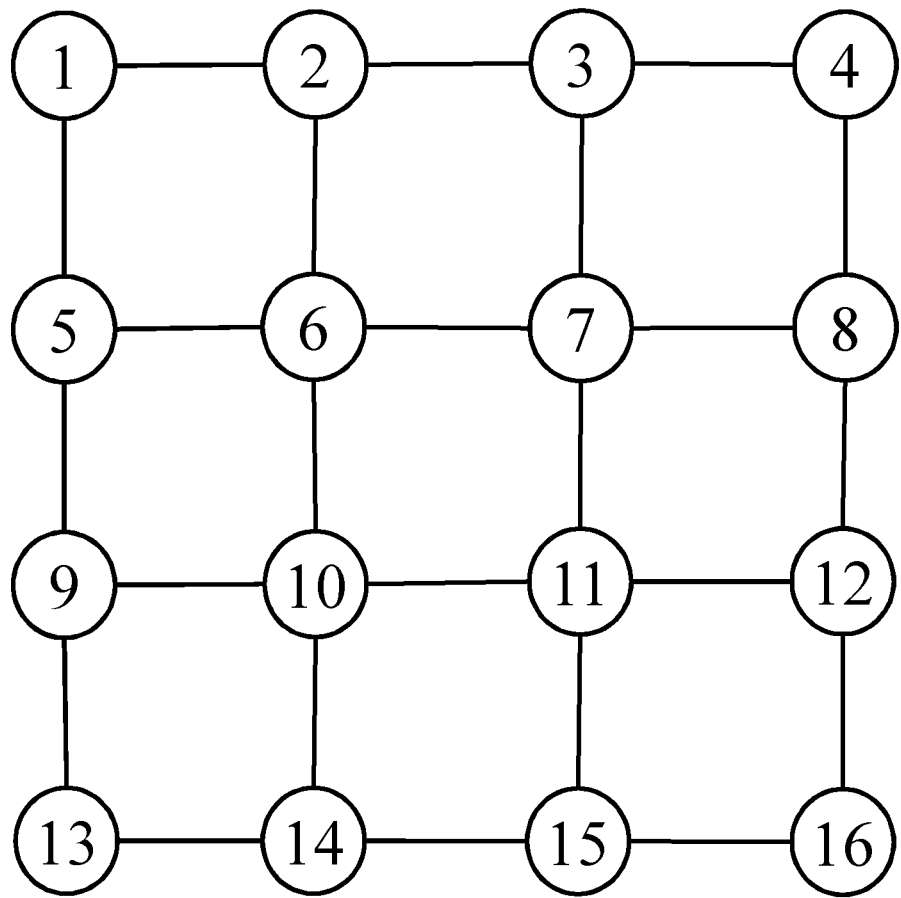
(a)
(b)
Fig. 6

METHOD AND APPARATUS FOR ENCODING AND DECODING DIGITAL IMAGES OR VIDEO STREAMS

FIELD OF THE INVENTION

The present invention relates to a method and an apparatus for encoding and/or decoding digital images; in particular, for coding and/or decoding digital images by means of the so-called graph-based transformations.

DESCRIPTION OF PRIOR ART

The Discrete Cosine Transform (DCT) is the most common transform used for block-based image and video compression (see K. Sayood, *Introduction to data compression*, Newnes, 2012); indeed, the Discrete Cosine Transform is at the basis of popular video coding standards such as MPEG-2 (Moving Picture Experts Group—used, for example, for terrestrial and satellite standard definition video broadcasting and in the DVD storage format), H.264/AVC (used for high-definition video broadcasting, streaming over IP networks and in Blu-Ray discs) and in the recently standardized H.265/HEVC (expected to replace H.264/AVC in the above-mentioned scenarios).

One of the main drawbacks of the Discrete Cosine Transform DCT is that when a block contains discontinuities, the resulting transform coefficients are not sparse and the high-frequency coefficients can have large magnitude. This leads to higher bitrate or reconstruction artefacts around the discontinuities.

Recently, the graph-based approach has been proposed, according to which high-dimensional data naturally reside on the vertices of graphs and they can be visualized as a finite collection of samples defined as graph signals, with one sample at each vertex of the graph (see D. I. Shuman, S. K. Narang, P. Frossard, A. Ortega, and P. Vandergheynst, "The emerging field of signal processing on graphs: Extending high-dimensional data analysis to networks and other irregular domains," Signal Processing Magazine, IEEE, vol. 30, no. 3, pp. 83-98, 2013).

In the last years, researchers have studied how to apply classical signal processing techniques in the graph domain.

Techniques for filtering, translation, modulation and down sampling in the graph domain have been developed.

Several graph transforms have also been proposed, such as the Graph Fourier Transform (G. Taubin, "A signal processing approach to fair surface design", in Proceedings of the 22nd annual conference on Computer graphics and interactive techniques, ACM, 1995, pp. 351-358).

In general, while graph-transforms have been shown to be more efficient than conventional block-based transforms, the overhead of graph transmission may easily outweigh the coding efficiency benefits.

Therefore, it is very important to design graph representations and corresponding graph transforms that are efficient also when graph has to be transferred to a decoder.

Document Sandryhaila et al. in "*Nearest-neighbor image model*", published in ICIP 2012 proceedings, propose to represent an image as a graph of nodes and arcs, where the arcs weights are determined so as to minimize the expected distortion at the receiver. However, such work does not teach how to compress the graph weights, by making difficult to apply this technique in a real-world environment.

Document US 2011/206288 A1, Ortega et al. describe an image encoding and decoding system using graph based pixel prediction. This document teaches how to encode and decode pictures through a predictor selection, but it does not teach how to compress the graph weights, by making difficult to apply this technique in a real-world environment.

Document Kim, Narang and Ortega in "*Graph based transforms for depth video coding*", published in ICASSP 2012 proceedings, propose to find the optimal adjacency matrix and compress it using context-based adaptive binary arithmetic coding following a fixed order; however, this document does not teach how to compress the graph weights, by making difficult to apply this technique in a real-world environment.

Document W. Hu, G. Cheung, A. Ortega, and O. C. Au in "*Multiresolution graph Fourier transform for compression of piecewise smooth images*", published in *IEEE Transactions on Image Processing*, propose to compress the piecewise smooth (PWS) images (e.g., depth maps or animation images) using a Graph Fourier Transform (GFT) to minimize the total signal representation cost of each pixel block, considering both the sparsity of the signal transform coefficients and the compactness of the transform description. However, this document reports unsatisfactory results on natural images, where the cost required to describe the graph outweighs the coding gain provided by the adaptive graph transform.

Document G. Shen, W. S. Kim, S. K. Narang, A. Ortega, J. Lee, and H. Wey, in "*Edgeadaptive transforms for efficient depth map coding*", published in Picture Coding Symposium (PCS2010) proceedings, propose an Edge-Adaptive graph-based Transforms (EATs) as an alternative to the standard DCTs used to coding depth maps employed for view synthesis in a multi-view video coding system. These transforms are combined with the DCT in H.264/AVC and a transform mode selection algorithm is used to choose between DCT and EAT in a Rate-Distortion optimized manner. However, also this method gives unsatisfactory results if used on natural images, because of the same reasons explained above.

Document Narang, Chao and Ortega in "*Critically sampled graph-based wavelet transforms for image coding*", published in APSIPA 2013 proceedings, propose to encode the image as a binary unweighted graph and encode it using JBIG of size $(2 N-1) \times (N-1)$, where N is the number of pixels in the original image. This encoding scheme produces images having a high level of encoding noise, since the binary unweighted graph limits the quantity of information that can be encoded.

Document G. Fracastoro, E. Magli, "Predictive graph Construction for image compression", in *Proc. IEEE International Conference on Image Processing (ICIP)*, 2015, pp. 2204-2208, describe a digital images or video streams encoding and decoding system using graph based pixel prediction. This document teaches how to quantize each element of the graph weights matrix, where each element is processed by means of a non-linear function (e.g., Cauchy function). This document teaches how to transmit a pixel prediction edge map in place of the more cumbersome weights matrix. Anyway, an amount of information related to the graph weights need to be sent at the decoder.

Recently, the intra-prediction technique was employed in the context of Graph Fourier Transforms (GFT). Intra-prediction is a popular tool for block based video coding standard, such as H.264/AVC and H.265/HEVC, for which one or more decoded pixels from a neighbouring block are used to predict pixels in the current block.

Document W. Hu, G. Cheung, and A. Ortega in "Intra-prediction and generalized graph Fourier transform for image coding" published in IEEE Signal Processing Letters, vol. 22, 2015, propose an optimized transform for the residual pixel prediction, based on a generalized version of Graph Fourier Transform (GFT). However, also this approach requires to send at the decoder additional information, such as objects contours, used to identify the transformation and intra-prediction chosen at the encoder.

In order to better understand the limits of the state of the art, a brief description of how a graph-based encoding-decoding image system works is provided below.

The architecture of a graph-based encoding-decoding system according to the state of art is illustrated in FIG. 1 and FIG. 2 in terms of its basic functional units.

With reference to FIG. 1 and FIG. 2, it is assumed that an image f (or a block thereof) has both width and height equal to $\sqrt{N}$, so that it comprises N pixels ($\sqrt{N} \times \sqrt{N} = N$).

Furthermore, it is assumed that f is encoded as a grayscale image, 8 bit per pixel, and that f can be also represented by a graph of vertices and arcs (V,A), wherein V are the pixels of the image, and A are the arcs that connect the pixels, defined according to some appropriate criteria.

The graph describing the image pixels can be represented as a N×N matrix (i.e., a matrix having $N^2$ elements) that it is referred as weights matrix W, as discussed later on.

FIG. 1 illustrates an image encoder 150 and an image decoder 170 based on the graph transform which aims to show the limitation of the current state of art about the transmission/memorization of the weights matrix W.

The encoder 150 includes at least a weights graph generation unit 100, a graph Laplacian unit 110, and a graph transform unit 120.

The weights graph generation unit 100 takes as input said N-pixels image f, and generates the N×N weights matrix W, which can be computed employing two alternative methods, as described below.

The first method computes the weights matrix W using a predetermined non-linear function (e.g., Gaussian or Cauchy function). In order to describe how the weights matrix W is computed, it is assumed that $d_{i,j}$ represents the distance in the grayscale space between the i-th pixel $f_i$ and the j-th pixel $f_j$ of the image f, e.g., $d_{i,j}$ can be computed as the absolute difference between the intensity values of the pixels $f_i$ and $f_j$:

$$d_{i,j}=|f_i-f_j| \quad (1)$$

Therefore, each element of the weights matrix W can be computed by means of the following Cauchy formula:

$$w_{i,j} = \frac{1}{1+d_{i,j}} \quad (2)$$

$$i \in N \wedge 0 \le i < N$$

$$j \in N \wedge 0 \le j < N$$

It turns out that the value of the weight of the graph arc connecting pixels $f_i$ and $f_j$, i.e., $w_{i,j}$, will be close to 1 ("high" arc weight) if $f_i$ and $f_j$ are similar pixels, whereas the $w_{i,j}$ will be close to 0 ("low" arc weight) if $f_i$ and $f_j$ are dissimilar.

The graph Laplacian unit 110 generates the transform matrix U taking as input the weights matrix W. This unit is configured for reading W and computing a diagonal matrix E having N×N dimensions such that the i-th element of its diagonal is equal to the sum of all the weights of all the arcs incident into the i-th pixel as described in W.

Hence, E is defined in matrix notation as shown in the following:

$$E=\text{diag}(W \cdot V1)$$

$$V1 \in R^{N,1} \wedge (\forall x \in N, 1 \le x \le N | V1_{x,1}=1) \quad (3)$$

After having computed the diagonal matrix E, the unit computes the matrix L (having N×N dimensions), as the difference between the diagonal matrix E and the weights matrix W; L is a symmetric matrix and is called the Laplacian of W. This computation step is summarized in matrix notation as shown below.

$$L=E-W \quad (4)$$

Finally, the unit computes the N×N matrix U known as transform matrix, wherein the columns of U are the eigenvectors of L, i.e., the columns of U are the vectors that allow to diagonalize L.

The graph transform unit 120 takes as input the image f (which is considered as a vector having N×1 components) and the transform matrix U, and computes the N×1 coefficients vector f^ via the matrix multiplication $$f^{\wedge}=U^T \cdot f \quad (5)$$

where $U^T$ is the transposed matrix of U.

The encoder then transmits the transform matrix U (or, alternatively, the weights matrix W from which U can be computed) and the coefficients vector f^ to the receiver node over a bandwidth constrained channel or memorizes them on a memory support for later use, e.g., for decoding purposes.

The decoder 170 includes, at least, a graph Laplacian unit 140 and inverse graph transform unit 180 configured for reading, from a storage device or through a communication channel, both the weights matrix W and the coefficients vector f^. For sake of simplicity, it is assumed that both W and f^ available to the decoders 170 are identical to those generated by the encoders 150, since in practical applications adequate measures are taken for minimizing read/write or channel errors occurring during information transfer from the encoder to the decoder.

The graph Laplacian unit 140, which is functionally analogous to the counterpart found at the transmitter side (unit 110), takes in input the weights matrix W and generates the transform matrix U as described above for the encoder counterpart.

The inverse graph transform unit 180 takes U and f^ as inputs and recovers the original image f. In order to perform this task, the unit 180 internally inverts the matrix $U^T$ by generating the N×N inverse transform matrix $(U^T)^{-1}$ which is, in the present case, equal to the matrix U, since U is composed by the eigenvectors of the Laplacian matrix of W; after that, the unit recovers the original image f via the following matrix multiplication which is known as the Inverse Graph Fourier Transform:

$$f=(U^T)^{-1} \cdot f^{\wedge} \quad (6)$$

Clearly, this first encoding-decoding approach makes necessary that the encoder conveys to the decoder both the weights matrix W, whose dimension is in the order of $N^2$ elements and the coefficients vector f^ whose dimension is in the order of N.

FIG. 2 illustrates another image encoder 210 and an image decoder 230 based on the graph transform which aims to show the limitation of the current state of art about the transmission/memorization of an edge map instead of the weights matrix and the coefficients vector f^.

The encoder 210 includes at least an edge map generation unit 215, a reconstructed weights graph generation unit 212, a graph Laplacian unit 213, and a graph transform unit 216.

The edge map generation unit 215 takes as input said N-pixels image f, and generates the N×1 edge map f': first the N×N weights matrix W, is computed using the Cauchy formula given by relation (2), wherein the pixel distances $d_{i,j}$ are quantize considering the two levels d and D (d<D), and then an edge-prediction algorithm is applied in order to obtain the edge map f' given the weights matrix W.

The reconstructed weights graph generation unit 212 takes as input said N×1 edge map f' and outputs the reconstructed N×N weights matrix W', by reverting the edge-prediction algorithm.

The graph Laplacian unit 213 generates the transform matrix U taking as input the reconstructed weights matrix W', by performing the same actions described in the unit 110.

The graph transform unit 216 takes as input the image f (which is considered as a vector having N×1 components) and the transform matrix U, then computes the N×1 coefficients vector f^, by performing the same actions described in the unit 120.

The encoder then transmits the edge map f' and the coefficients vector f^ to the receiver node over a bandwidth constrained channel or memorizes them on a memory support for later use, e.g., for decoding purposes.

The decoder 230 includes, at least, a reconstructed weights graph generation unit 232, a graph Laplacian unit 233 and inverse graph transform unit 231, and is configured for reading, from a storage device or through a communication channel, both the edge map f' and the coefficients vector f^.

For sake of simplicity, it is assumed that both f' and f^ available to the decoders 230 are identical to those generated by the encoders 210, since in practical applications adequate measures are taken for minimizing read/write or channel errors occurring during information transfer from the encoder to the decoder.

The reconstructed weights graph generation unit 232 and the graph Laplacian unit 233, are functionally analogous to the counterpart found at the transmitter side. The reconstructed weights graph generation unit 232 takes in input the edge map f' and generates the reconstructed weights matrix W', subsequently the graph Laplacian unit 233 takes in input the reconstructed weights matrix W' and generates the transform matrix U as described above for the encoder counterpart.

The inverse graph transform unit 231 takes U and f^ as inputs and outputs the recovered image f~, by performing the same actions described in the unit 180.

This second encoding-decoding approach makes necessary that the encoder conveys to the decoder both the edge map f' and the coefficients vector f^, which have both dimension in the order of N.

In real world applications, the communication takes place over a bandwidth constrained channels, it is hence desirable that either (or both) f^ and W can undergo some effective form of compression prior they are put on the channel. The same applies to the memorization of the image f on a storage unit having limited capacity.

Regarding the problem of compressing the coefficients vector f^, its properties are such that it can be effectively compressed via existing lossy or lossless method based on quantization and entropy coding schemes.

Quantization is used to increase the amount of compression while reducing the fidelity level of the reconstruction.

The GFT transformed coefficients have spectral properties that can be exploited similarly to what is done in the state of the art with DCT coefficients.

Conversely, the weights matrix W cannot be effectively compressed by means of any of the existing compression techniques, since its properties do not enable efficient compression.

SUMMARY OF THE INVENTION

The present invention aims to solve these and other problems by providing a method and an apparatus for encoding and/or decoding digital images or video streams.

The basic idea of the present invention is to encode the graph representing an image avoiding the need to encode the graph weights, or borders maps thereof, as side information.

This invention teaches how to consider a similar approach used in spatial prediction techniques, in order to predict effectively graph weights in place of pixels: the graph weights of each block composing an image can be predicted from the reconstructed pixel samples of one or more adjacent previously coded blocks.

In particular, two directional graph weight prediction (GWP) modes are disclosed.

Moreover, the presented approach can be used jointly with other graph based intra prediction methods known in the art, showing an effective coding gain.

BRIEF DESCRIPTION OF DRAWING

The characteristics and other advantages of the present invention will become apparent from the description of an embodiment illustrated in the appended drawings, provided purely by way of no limiting example, in which:

FIG. 5 shows an example of a grayscale image (FIG. 5(a)) and an exemplary image block (FIG. 5(b)) of said grayscale image;

FIG. 6a shows a possible way for vectorising (serializing) an image or an image block represented as a 4-connected square grid graph, and FIG. 6b shows a vector where the i-th element corresponds to the i-th pixel in the block counted in raster scan order;

DETAILED DESCRIPTION OF THE INVENTION

In this description, any reference to "an embodiment" will indicate that a particular configuration, structure or feature described in regard to the implementation of the invention is comprised in at least one embodiment. Therefore, the phrase "in an embodiment" and other similar phrases, which may be present in different parts of this description, will not necessarily be all related to the same embodiment. Furthermore, any particular configuration, structure or feature may be combined in one or more embodiments in any way deemed appropriate. The references below are therefore used only for simplicity sake, and do not limit the protection scope or extension of the various embodiments.

Figure 11:
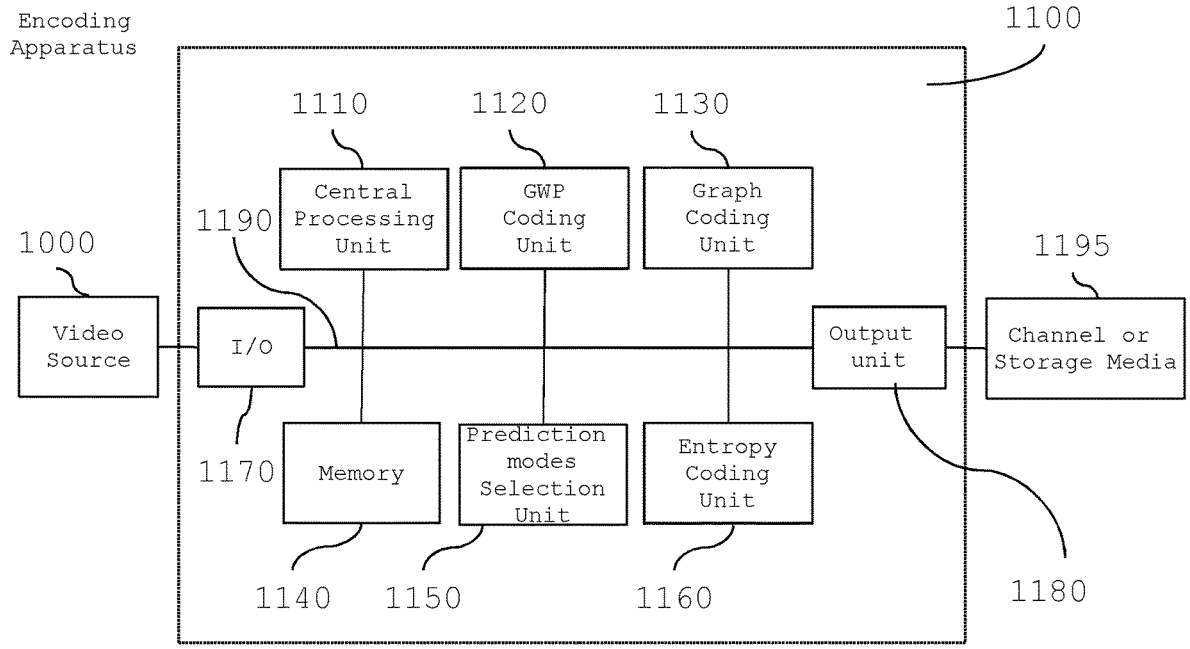
FIG. 11 shows a block diagram illustrating apparatuses for compressing digital images or video streams according to the present invention.

With reference to FIG. 11, an apparatus 1100 for compressing digital images or video streams (also named encoding apparatus 1100) comprises the following parts:

processing unit 1110, like a Central Processing Unit (CPU), configured for executing a set of instruction for carrying out a method for encoding digital images or video streams according to an embodiment of the invention (said method will be described in details in the following of the present description);

memory unit 1140 containing data relating to the image to be compressed and preferably the instructions that implement the method for encoding digital images or video streams according to an embodiment of the invention, wherein the image data are a representation of at least a portion of said image and are preferably in binary format, and wherein said memory unit 1140 may also contain the result of the execution of instructions of said method;

input unit 1170 (e.g., I/O unit), which can be configured by the CPU 1110 to read from a (video) source 1000 images or video streams to be processed; such input unit may for example include an adapter according to at least one of the following standards: USB, Firewire, RS232, IEEE 1284, Ethernet, Wi-Fi, or the like;

a graph weights prediction (GWP) coding unit 1120, which is configured for fetching the original image or video stream from the memory unit 1140, executing the phases of the method for obtaining vertical and horizontal weights prediction modes of the graph related to the blocks of the image; in particular, the weights prediction for each block is performed by taking into account the reconstructed (de-quantized and inverse-transformed) pixel intensities of the previously coded adjacent block, obtaining the vertical and horizontal predicted weights related to the graph of each block, according to both vertical and horizontal weights prediction modes, and then storing them in the memory unit 1140;

a graph coding unit 1130, which is configured for executing the phases of the method for encoding digital images or video streams according to an embodiment of the invention; in particular, this unit is first configured for performing the Graph Fourier Transform of the blocks of the image or video data, wherein said Graph Fourier Transform is first determined as a function of the vertical predicted weights and next is determined as a function of the horizontal predicted weights, obtaining for each block a set of first coefficients related to the vertical prediction mode, and a set of second coefficients related to the horizontal prediction mode, which are quantized according to a predetermined quantization parameter q, and storing the resulting sets of quantized coefficients back into the memory unit 1140;

a prediction modes selection unit 1150, which is configured for executing the phases of the method for encoding digital images or video streams according to an embodiment of the invention; in particular, this unit is configured for selecting the vertical or the horizontal prediction mode for each coded block, by choosing among the sets of quantized coefficients the prediction mode which produces the highest number of zero coefficients for each block, and signalling the selected weights prediction mode of each block, for example into a binary file, by using a predefined binary word for each mode, and storing the resulting binary file back into the memory unit 1140;

an entropy coding unit 1160, which is configured for fetching from the memory unit 1140 the binary file which stores the selected mode information, and the set of the selected quantized coefficients, arranging them in a sequence, according to any predefined order (e.g., raster-scanner order or a vertical scan order), the same order used in the decoding apparatus 1200, wherein the selected modes information and the selected quantized coefficients of each block are taken as an input to an entropic encoder which can be, for example, a context adaptive binary arithmetic coding (CABAC) or a context-adaptive variable-length coding (CAVLC) based encoder;

output unit 1180 (e.g., a network or storage adapter), which can be configured by the CPU 1110 to transmit, through a communication channel, the processing result to a destination 1195 (e.g., a storage media, a remote client or the like); such output unit may for example include an adapter according to at least one of the following standards: Ethernet, SATA, SCSI, or the like;

a communication bus 1190, which allows the exchange of information between the CPU 1110, the GWP coding unit 1120, the graph coding unit 1130, the memory unit 1140, the prediction modes selection unit 1150, the entropy coding unit 1160, the input unit 1170, and the output unit 1180; as an alternative to using the communication bus 1190, the CPU 1110, the GWP coding unit 1120, the graph coding unit 1130, the memory unit 1140, the prediction modes selection unit 1150, the entropy coding unit 1160, the input unit 1170, and the output unit 1180 can be connected by means of a star architecture.

The video source 1000 can be either a provider of live images, such as a camera, or a provider of stored contents such as a disk or other storage and memorization devices. The Central Processing Unit (CPU) 1110 takes care of activating the proper sequence of operations performed by the units 1120, 1130, 1150, 1160 in the encoding process performed by the apparatus 1100.

These units can be implemented by means of dedicated hardware components (e.g., CPLD, FPGA, or the like) or can be implemented through one or more sets of instructions which are executed by the CPU 1110; in the latter case, the units 1120, 1130, 1150, 1160 are just logical (virtual) units.

When the apparatus 1100 is in an operating condition, the CPU 1110 first fetches the image from the video source and loads it into the memory unit 1140.

Next, the CPU 1110 activates the graph weights prediction (GWP) coding unit 1120, executes the phases of the method (see FIG. 3 step 310), for obtaining vertical and horizontal weights prediction modes of the graph related to the blocks of the image, and stores the resulting vertical and horizontal predicted weights back into the memory unit 1140.

Next, the CPU 1110 activates the graph coding unit 1130, which fetches from the memory 1140 the vertical and horizontal predicted weights, executes the phases of the method for encode and quantize digital images or video streams according to an embodiment of the invention (see FIG. 3 steps 315,320), and stores the resulting sets of quantized coefficients back into the memory unit 1140.

Then the CPU 1110 activates the prediction modes selection unit 1150, which fetches from the memory 1140 the sets of quantized coefficients, executes the phases of the method for selecting said quantized coefficients according to the present invention (see FIG. 3 step 325), and stores the selected mode information of each block in the memory 1140.

Successively, the CPU 1110 activates the entropy coding unit 1160, which fetches from the memory the selected mode information and the set of the selected quantized coefficients, executes the phases of the method for arranging said selected quantized coefficients in a sequence according to the present invention (see FIG. 3 step 330), then this unit entropy encodes said selected mode information and the sequence of selected quantized coefficients, obtaining a bitstream which is stored into the memory 1140.

At this point, the CPU 1110 may dispose of the data from the memory unit 1140 which are not required anymore at the encoder side 1100.

Finally, the CPU 1110 fetches the bitstream from memory 1140 and puts it into the channel or saves it into the storage media 1195.

Figure 12:
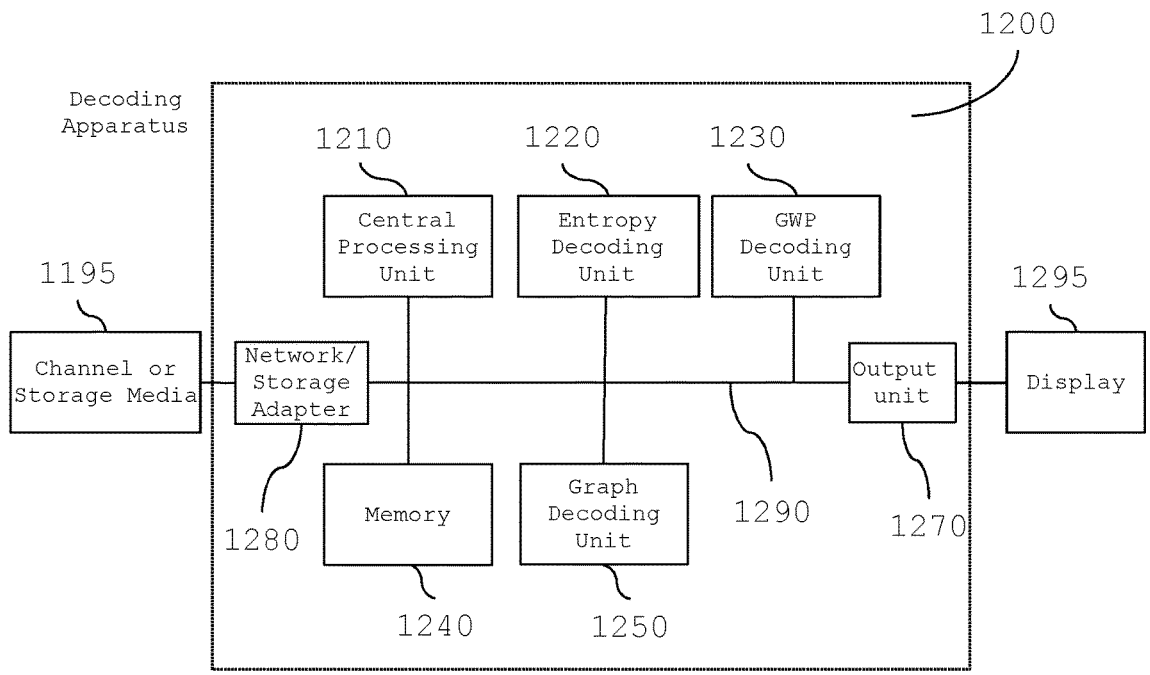
FIG. 12 shows a block diagram illustrating apparatuses for decompressing digital images or video streams according to the present invention.

With reference also to FIG. 12, an apparatus 1200 for decompressing digital images or video streams (also named decoding apparatus 1200) comprises the following parts:

- processing unit 1210, like a Central Processing Unit (CPU), configured for executing a set of instruction for carrying out a method for decoding digital images or video streams according to an embodiment of the invention (said method will be described in details in the following of the present description);
- memory unit 1240 containing data relating to the compressed image received and preferably the instructions that implement the method for decompressing digital images or video streams according to an embodiment of the invention, wherein the image data are a representation of at least a portion of said image and are preferably in binary format, and wherein said memory unit 1240 may also contain the result of the execution of instructions of said method;
- input unit 1280 (e.g., a network or storage adapter), which can be can be configured by the CPU 1210 to read the encoded images or video streams from a communication channel or storage media 1200; said input unit 1280 may for example comprise an adapter according to at least one of the following standards: Ethernet, SATA, SCSI, or the like;
- an entropy decoding unit 1220, which is configured for executing the phases of the method for receiving and entropy decoding the bitstream, obtaining an ordered sequence of quantized coefficients of each coded block of the image, according to the encoding apparatus 1100, and also decoding the corresponding mode prediction information for the blocks of the sequence;
- a graph weights prediction (GWP) decoding unit 1230, configured for executing the phases of the method for obtaining vertical or horizontal predicted weights of the graph related to the blocks of the sequence, according to the mode information of the decoded block; in particular, the weights prediction for each block is performed by taking in to account the reconstructed (de-quantized and inverse-transformed) pixel intensity of the previously decoded adjacent block, obtaining the vertical or the horizontal predicted weights related to the graph of the blocks of the sequence;
- a graph decoding unit 1250, which is configured for executing the phases of the method for decompressing digital images or video streams according to an embodiment of the invention; in particular, this unit is configured for de-quantizing the coefficients of each decoded block, and to perform an inverse graph Fourier transform of said de-quantized coefficients, wherein the said graph Fourier transform is determined as a function of the vertical or the horizontal predicted weights, such that the reconstructed image is recovered;
- output unit 1270, like a video adapter, which can be configured by the CPU 1210 to reproduce and/or output, preferably on a display 1295, the processed (decoded or decompressed) images or video streams; said output video unit may for example include an adapter according to at least one of the following standards: VGA, S-video, HDMI, Ethernet or the like;
- a communication bus 1290, which allows the exchange of information between the CPU 1210, the entropy decoding unit 1220, the graph weights prediction decoding unit 1230, the graph decoding unit 1250, the memory unit 1240, the output unit 1270, and the input unit 1280; as an alternative to using the communication bus 1290, the CPU 1210, the entropy decoding unit 1220, the graph weights prediction decoding unit 1230, the graph decoding unit 1250, the memory unit 1240, the output unit 1270, and the input unit 1280 can be connected by unit of a star architecture.

As for the previously described encoding apparatus 1100, also the CPU 1210 of the decoding apparatus 1200 takes care of activating the proper sequence of operations performed by the units 1220, 1230 and 1250.

These units can be implemented by means of dedicated hardware components (e.g., CPLD, FPGA, or the like) or can be implemented through one or more sets of instructions which are executed by the CPU 1210; in the latter case, the units 1220 and 1230 are just a logical (virtual) units.

When the apparatus 1200 is in an operating condition, the CPU 1210 first fetches the bitstream from the channel or storage media 1195 and loads it into the memory unit 1240.

Then, the CPU 1210 activates the entropy decoding unit 1220, which receives from the memory 1240 the bitstream, executes the phases of the method for obtaining an ordered sequence of quantized coefficients of each coded block and the corresponding mode prediction information for the blocks of the sequence, according to an embodiment of the invention (see FIG. 4 steps 400,405), and stores them into the memory unit 1240.

Successively, the CPU 1210 activates the graph weights prediction (GWP) decoding unit 1230, which fetches from the memory 1240 the sequence of quantized coefficients and the corresponding mode prediction information for the blocks of the sequence, executes the phases of the method for obtaining vertical or horizontal weights prediction modes of the graph related to the blocks of the sequence, according to an embodiment of the invention (see FIG. 4 step 410), and stores them into the memory unit 1240.

Then, the CPU 1210 activates the graph decoding unit 1250, which fetches from the memory 1240 the predicted weights of each block, executes the phases of the method for de-quantizing the coefficients of each block, and to perform an inverse graph Fourier transform of said de-quantized coefficients, on the basis of the reconstructed weights, according to an embodiment of the invention (see FIG. 4 steps 415,420), recovering the reconstructed image (see FIG. 4 step 420), and stores into the memory unit 1240 the recovered image or video signal.

At this point, the CPU 1210 may dispose of the data from the memory which are not required anymore at the decoder side.

Finally, the CPU may fetch from memory 1240 the recovered image and send it, by means of the output unit 1270, to the display unit 1295.

It should be noted how the encoding and decoding apparatuses described in the figures may be controlled by the CPU 1210 to internally operate in a pipelined fashion, enabling to reduce the overall time required to process each image, i.e., by performing more instructions at the same time (e.g., using more than one CPU and/or CPU core).

It should also be noted than many other operations may be performed on the output data of the coding device 1100 before sending them on the channel or memorizing them on a storage unit, like modulation, channel coding (i.e., error protection).

Conversely, the same inverse operations may be performed on the input data of the decoding device 1200 before effectively process them, e.g., demodulation and error correction. Those operations are irrelevant for embodying the present invention and will be therefore omitted.

Besides, the block diagrams shown in FIG. 11 and FIG. 12 are of exemplificative nature only; they allow to understand how the invention works and how it can be realized by the person skilled in the art.

The person skilled in the art understands that these charts have no limitative meaning in the sense that functions, interrelations and signals shown therein can be arranged in many equivalents ways; for example operations appearing to be performed by different logical blocks can be performed by any combination of hardware and software resources, being also the same resources for realizing different or all blocks.

The encoding process and the decoding process will now be described in detail.

Encoding

In order to show how the encoding process occurs, it is assumed that the image to be processed is preferably a grayscale image where each pixel is encoded over 8 bit so that the value of said pixel can be represented by means of an integer value ranging between 0 and 255, see the example off shown in FIG. 5(a).

In presence of color or multispectral image the encoding process needs to be iterated on every image channel, e.g., red, green and blue channels in the case of color images in RGB color space, or Y, U, V channels if luma/chrominances channels are used, or any other color or multispectral set of channels.

In order to simplify the presentation in the following, said image is assumed to be subdivided in square blocks which sizes can be for example 4×4, 8×8, 16×16 pixels, etc.

FIG. 5(b) shows a 4×4 block of the image shown in FIG. 5(a). Nonetheless the process can be applied to blocks of arbitrary shape, e.g., for example rectangular.

Even non-polygonal (irregular) shapes can be processed without modifying the proposed mechanism, provided that a weighted graph is constructed to represent the relations among a set of nodes that represents the pixel in the area (that can have an arbitrary shape) to be coded.

With reference also to FIG. 6(b), each image block is represented by means of an N×1 vector where the i-th element preferably corresponds to the i-th pixel in the block counted in raster scan order; hence, FIG. 6(a) shows a possible way of vectorising the image block representation starting from a bi-dimensional matrix or graph form, wherein the nodes represent the pixels and the arcs the horizontal and vertical adjacencies, and wherein the block has a square shape and N is assumed to be 16.

Each n-th pixel (node) is numbered according to the raster scan order from 1 to 16 and transformed in the n-th element of the vector f (see FIG. 6(b)).

Therefore, for example, in an embodiment of the invention pixel $6(f_6)$ is considered adjacent only to pixels $2(f_2)$, $5(f_5)$, $7(f_7)$ and $10(f_{10})$, while pixel $13(f_{13})$ is adjacent to pixels $9(f_9)$ and $14(f_{14})$.

Furthermore, is assumed that each block has the 4-connected grid graph topology, shown in FIG. 6(a), which is the most used for graph-based image compression, since its number of edges $M=2\sqrt{N}(\sqrt{N}-1)$ is lower than other topologies, and so the coding cost is limited.

Figure 7:
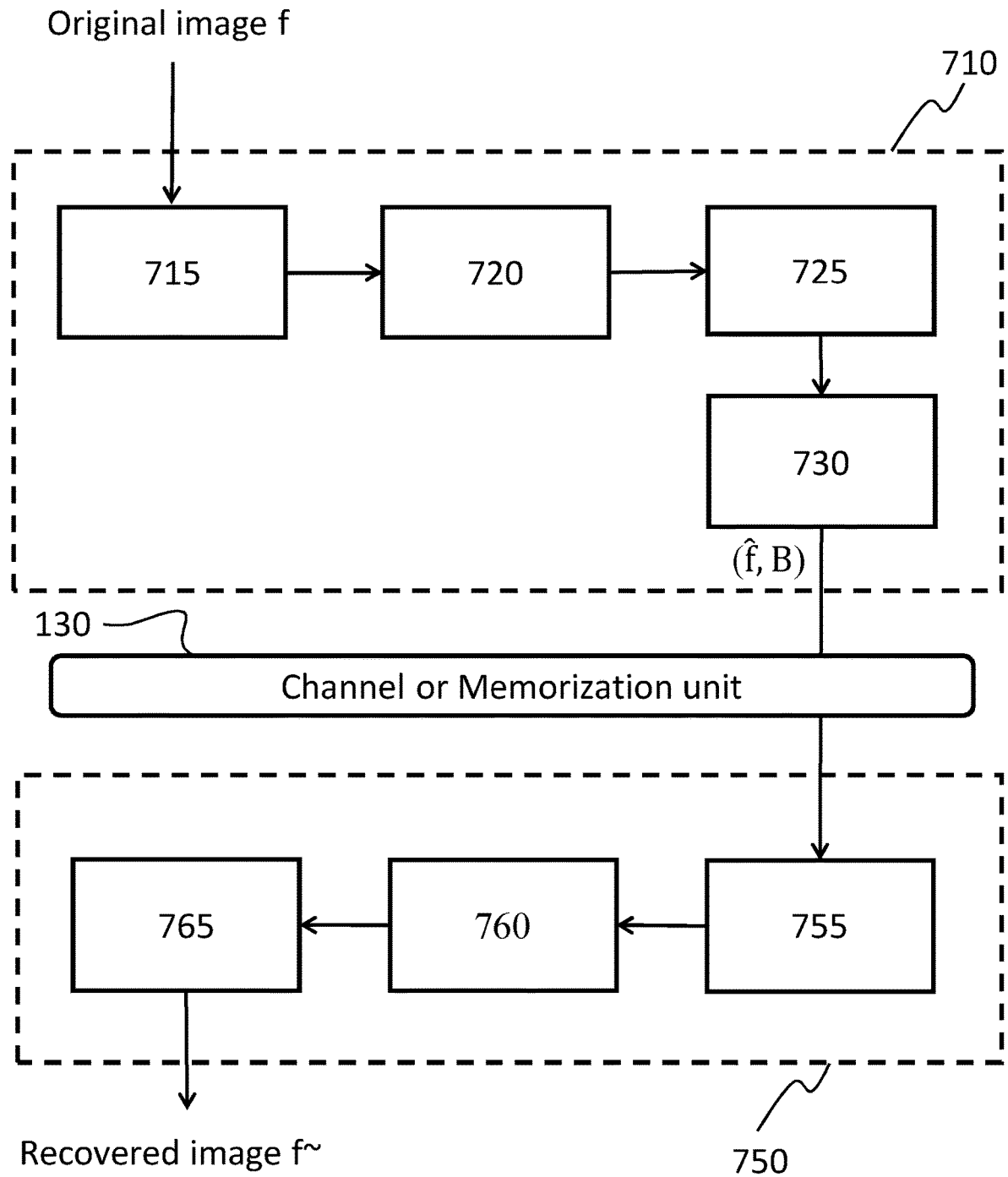
FIG. 7 shows a block diagram illustrating apparatuses for compressing/decompressing digital images or video streams according to the present invention.

With also reference to FIG. 7, it is now described how the different parts of the encoding apparatus 710 interact for compressing digital images or video streams.

Figure 1:
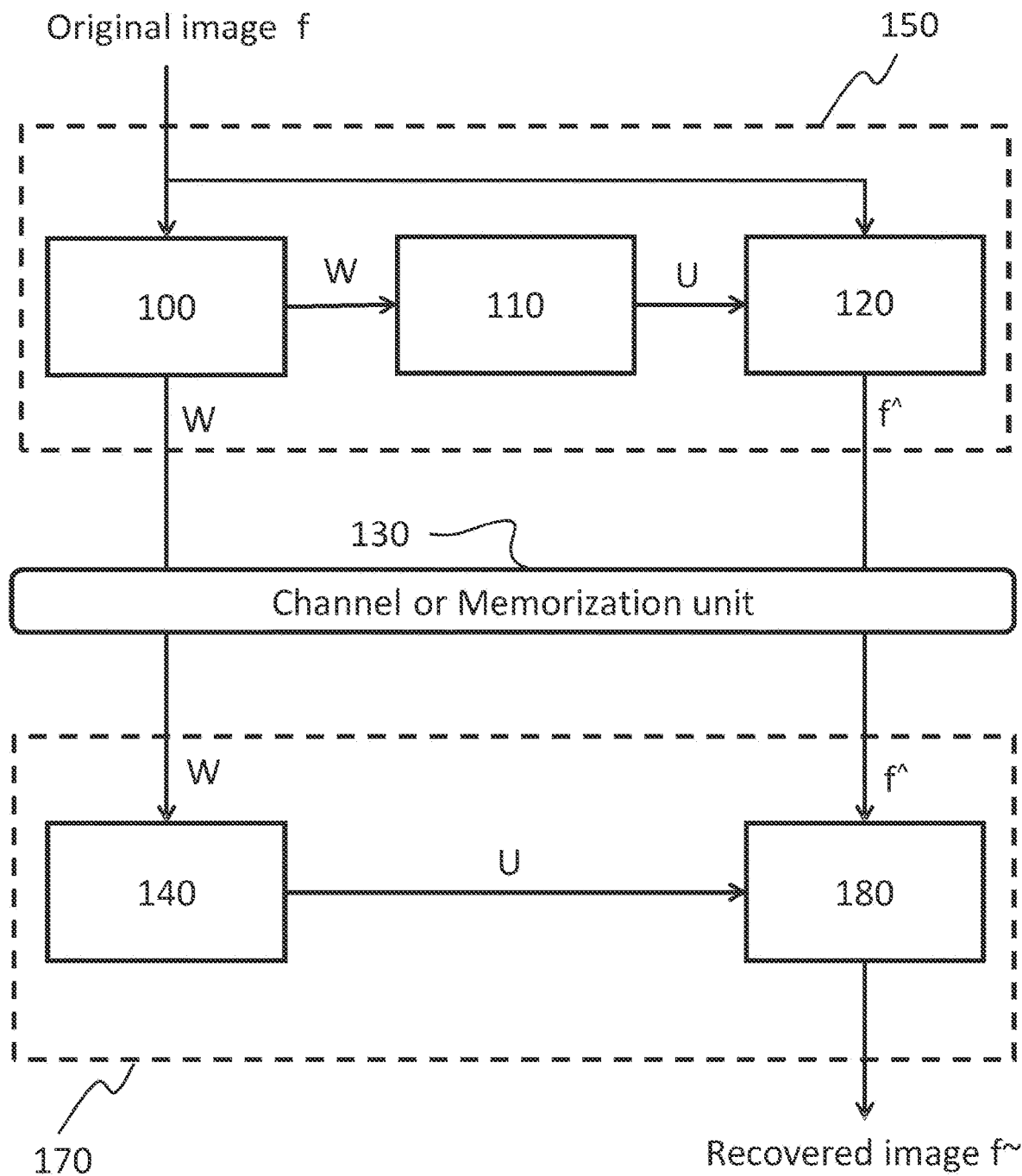
FIG. 1 shows a block diagram of a reference graph-based image encoding-decoding system according to the state of art.
Figure 2:
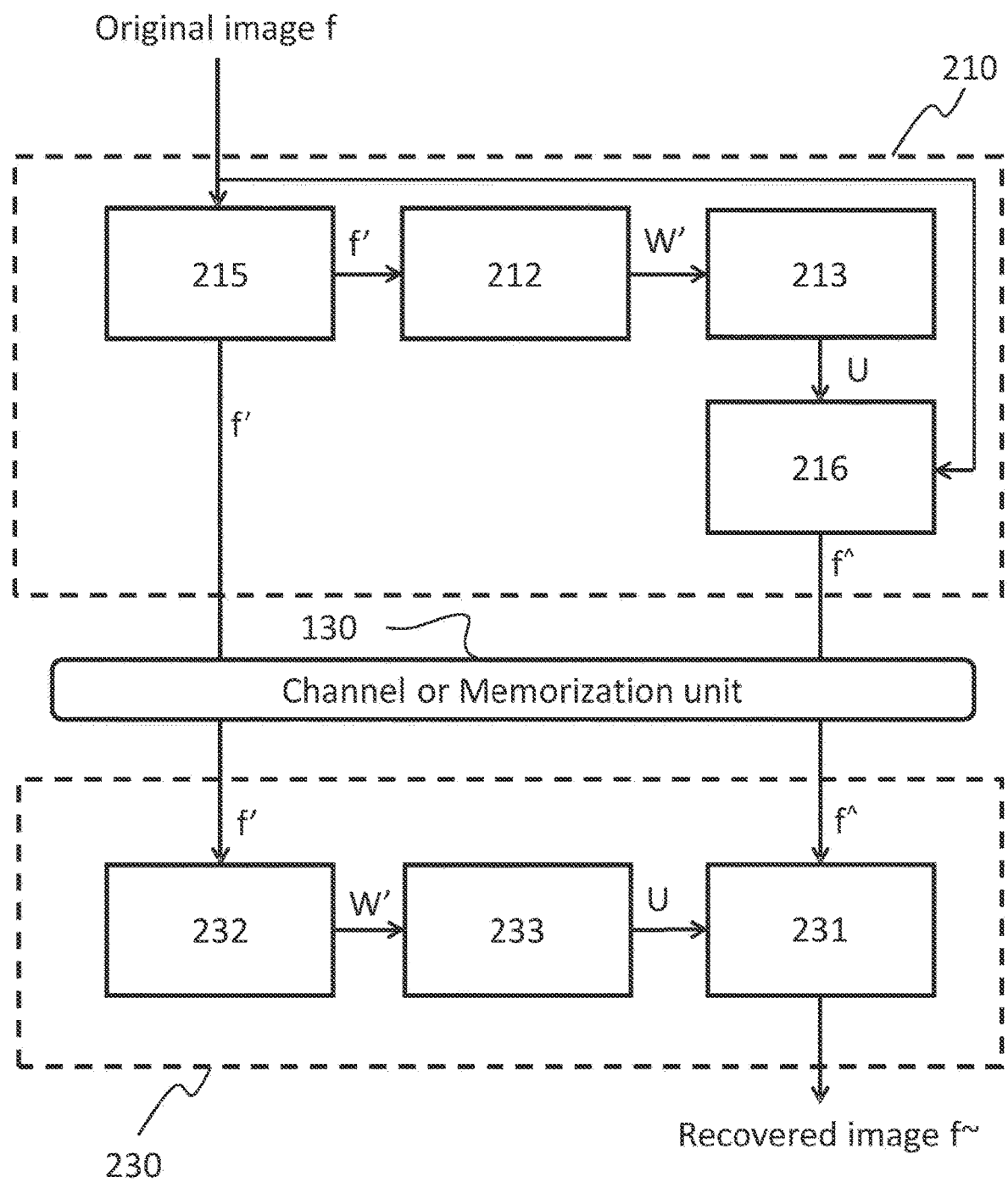
FIG. 2 shows another block diagram of a reference graph-based image encoding-decoding system according to the state of art.
Figure 3:
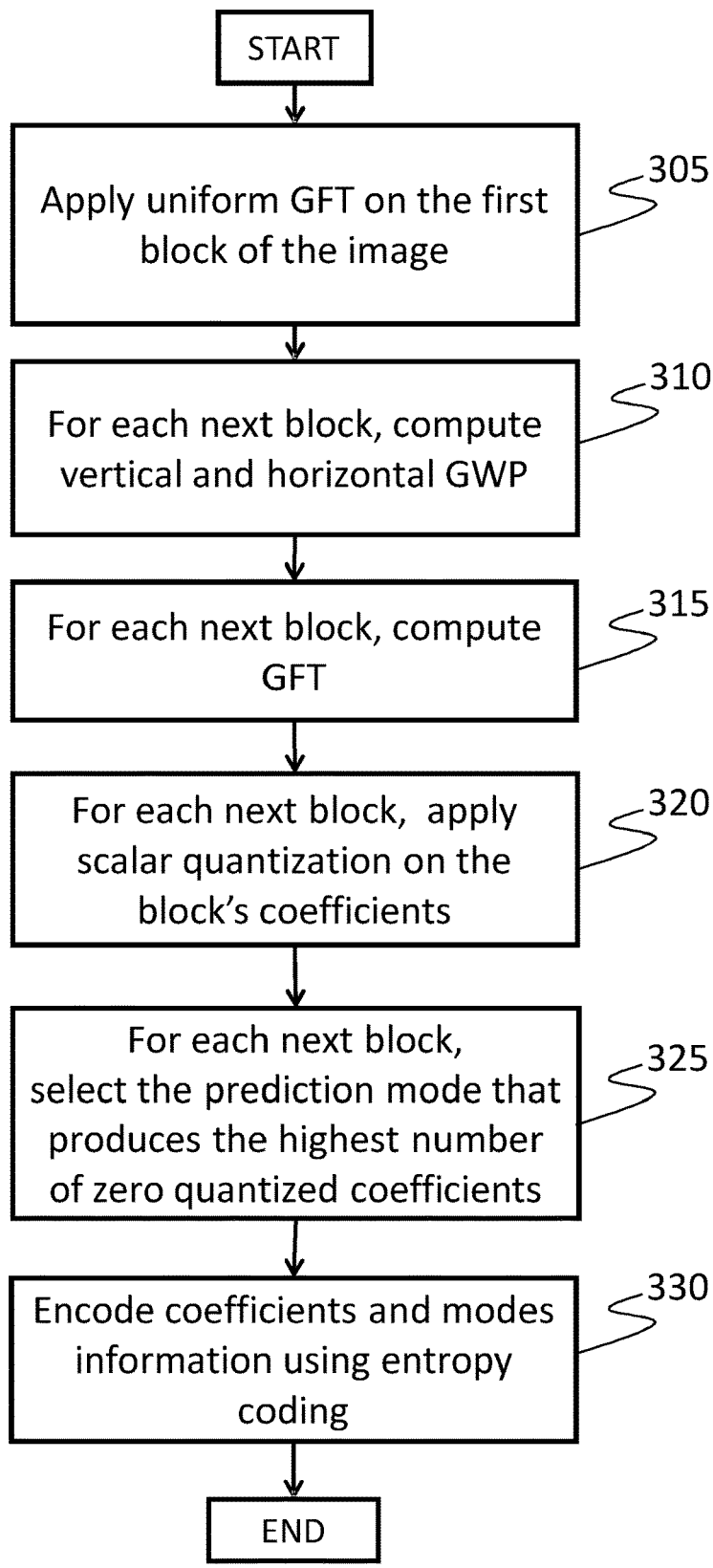
FIG. 3 shows the functioning of the apparatus for encoding digital images or video streams according to the present invention.
Figure 8:
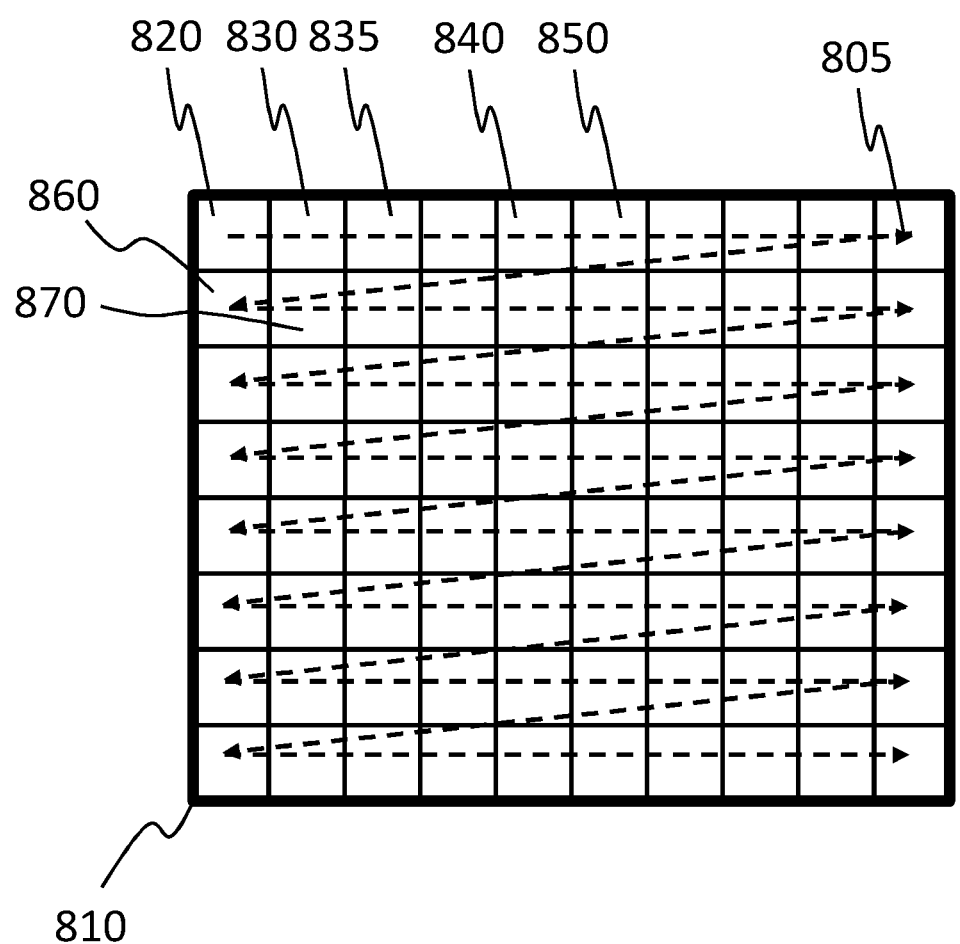
FIG. 8 shows an image which is partitioned in non-overlapping blocks, and an example of the scanning order of the blocks.

With also reference to FIG. 3 and FIG. 8, the graph weights prediction unit 715 preferably performs the following steps:

an initial coding 305 wherein, through the graph Fourier transform (GFT) techniques, the first block, e.g., the most top-left block 820 of the image 810 is graph-transformed, wherein the graph topology is the 4-connected square grid, and the graph weights {w} are all set at a fixed value $\mu \in (0,1)$.

If $\mu=1$ the GFT turns out to coincide with the well-known separable discrete cosine transform (DCT), also said uniform GFT. The GFT on the first block 820 is thus performed according to relations (3), (4) and (5), then the obtained coefficients f are quantized according to a predefined parameter q, so that $\hat{f}^q = \text{round}(\hat{f}/q)$; of course no GWP prediction is possible on the image block encoded as a first: the same applies to any initially encoded block in other predefined orders like in a vertical, zig-zag or helicoidal scan;

a graph weights prediction (GWP) 310 wherein, the weights of graph related to a given block of the image are predicted, on the basis of the reconstructed samples related to a block, which is adjacent to said given block; in particular, a predefined order for selecting the blocks of the image can be considered, e.g., from top-left to right (see FIG. 8 element 805), the weights of the block 830 are predicted considering the reconstructed coefficients of the first block 820, next the weights of the successive blocks, e.g., block 850, are predicted through the reconstructed coefficients (i.e., the reconstructed pixel samples) of the previously coded adjacent block e.g., block 840, as pictured in FIG. 8.

In this way, except for the first block 820, the graph weights of each block composing the image can be predicted from the reconstructed pixel samples of the adjacent previously coded block.

It should be noted that the pixel samples correlations among adjacent blocks of the image, allow to predict the graph weights of a given adjacent block of the image.

This is a new approach in respect to what is known in the art, where the pixel samples correlations are used for predicting pixel samples of a given adjacent block of the image, that is known as spatial prediction.

Instead, according to an embodiment of the invention, the graph weights (not the pixels themselves) are predicted on the base of at least one block of reconstructed pixel values that have been encoded and decoded before the current one according to the coding order predetermined for both the encoder and decoder.

Generally speaking, one, more than one, or all the pixel blocks previously encoded and decoded (i.e., reconstructed) can be used for predicting the weight matrix of the current one. In general, a plurality (one or more) of pixels of a previously reconstructed block is used for predicting the current block.

In a particularly advantageous embodiment of the invention, only the block closest to the current one (whose graph weights are to be predicted) are considered for performing the prediction; this is because in general the closer the pixel blocks are, the higher the spatial correlation is there between the pixels and the lower the approximation error caused by the prediction.

In a particular embodiment of the invention only the blocks adjacent to the current one are considered for performing the prediction; two blocks are adjacent if each block has at least a border pixel which is contiguous to the border pixel of the other block. For example in FIG. 8 blocks 820, 830, 835 and 860 are adjacent to block 870 among those coded before block 870.

So, for instance, with reference to FIG. 8, in the particular predetermined scan order considered there, the block 870 has as previously encoded and reconstructed blocks all the blocks of the first row, comprising the blocks 820, 830, 835, 840, 850, 805 and the block 860 as well.

So, in principle, any one of them, taken singularly or in any combination thereof, can be used for predicting the block 870.

In a particular embodiment of the invention, only the blocks previously reconstructed that are adjacent to the block 870 are used for the GWP of such block. So, the blocks 820 (diagonally top left), 830 (vertical top), 835 (diagonally top right) and 860 (horizontal left) can be used either singularly or in any combination thereof for the GWP of block 870.

In another embodiment of the invention, for the sake of simplicity only one previously reconstructed block in the predetermined order is effectively used for the GWP of the current block, even if more than one block is considered as a candidate for effecting the prediction and eventually, due to some selection criteria, only one of the candidate blocks is actually used as a predictor block.

In another particular embodiment, only the blocks having multiple border pixels in common with the current block are considered for performing the GWP of the current block.

In the particular embodiment in which a raster scan order is selected as predetermined order (like in FIG. 8), only one among the (top) vertical or the (left) horizontal block is used for predicting the current block.

The expressions top and left put within round brackets are pleonastic due to the particular predetermined order of this embodiment and can be omitted; it is simply related to about vertical or horizontal GWP modes, respectively.

If there is only one horizontal or one vertical block previously reconstructed adjacent to the current block only such present one can be used for the prediction. The first block in the predetermined order has no previous blocks; therefore, it cannot be predicted and has to be calculated (see step 305 of FIG. 3).

In this last embodiment, two graph weight prediction (GWP) modes are considered: the vertical and the horizontal weights prediction mode.

Figure 9:
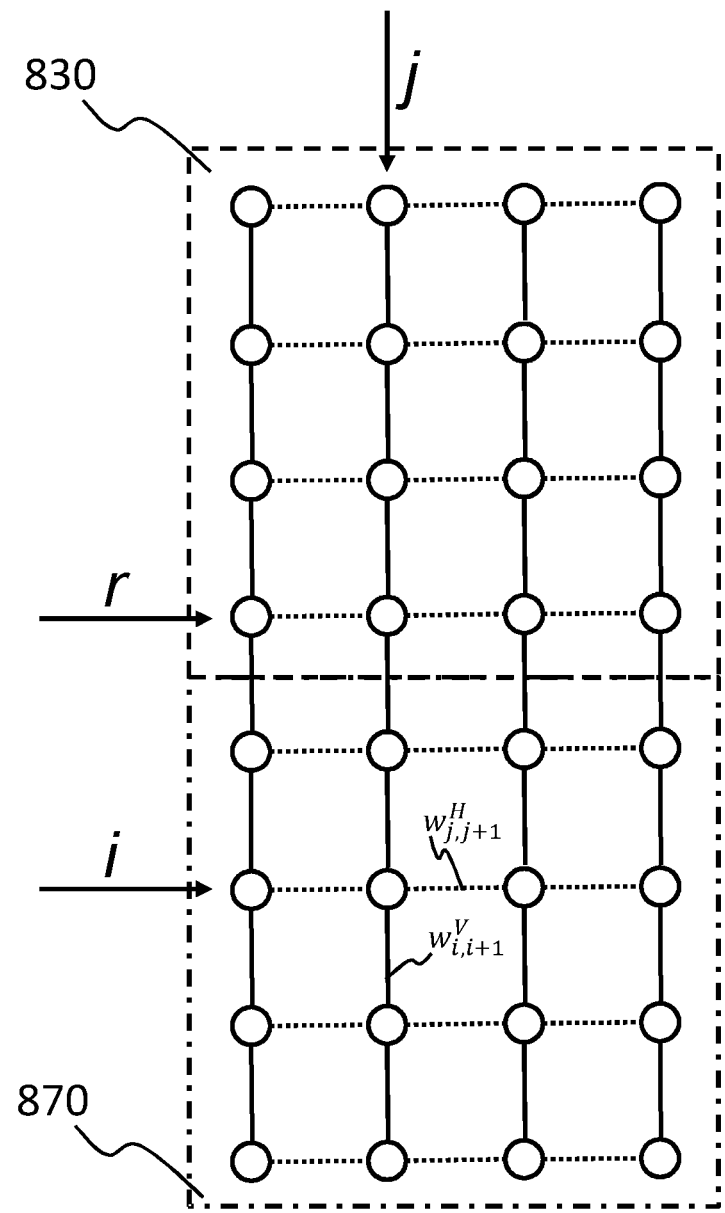
FIG. 9 illustrates the vertical weights prediction mode, as disclosed in the present invention.

With reference to block 870, the vertical weights prediction mode takes into account the reconstructed samples related to the adjacent previously coded block 830; in particular, with reference to FIG. 9, the vertical weights $w_{i,i+1}^V$ for each row $i \in [1,3]$ of the block 870 can be given by $$w_{i,i+1}^V = \rho_i^V; \rho_i^V \in [0,1] \quad (7)$$

whereas the horizontal weights $w_{j,j+1}^H$ for each column $j \in [1,3]$ of the block 870 can be predicted considering the set of reconstructed samples $S^V = \{x_{r,1}, x_{r,2}, x_{r,3}, x_{r,4}\}$ of the reference row r in the adjacent previously coded block 830, so that $$w_{j,j+1}^H = f(|x_{r,j+1}|) \quad (8)$$

where the function $f$ can be a non-linear function (e.g., Cauchy or Gaussian function), such that the weights increase when the reconstructed samples are similar, as explained above (see relation (2)).

In the case the Cauchy function, $f$ can be chosen as $$f(d) = \frac{1}{1 + \left(\frac{d}{\alpha}\right)^2}; \alpha \in (0, +\infty). \quad (9)$$

Figure 10:
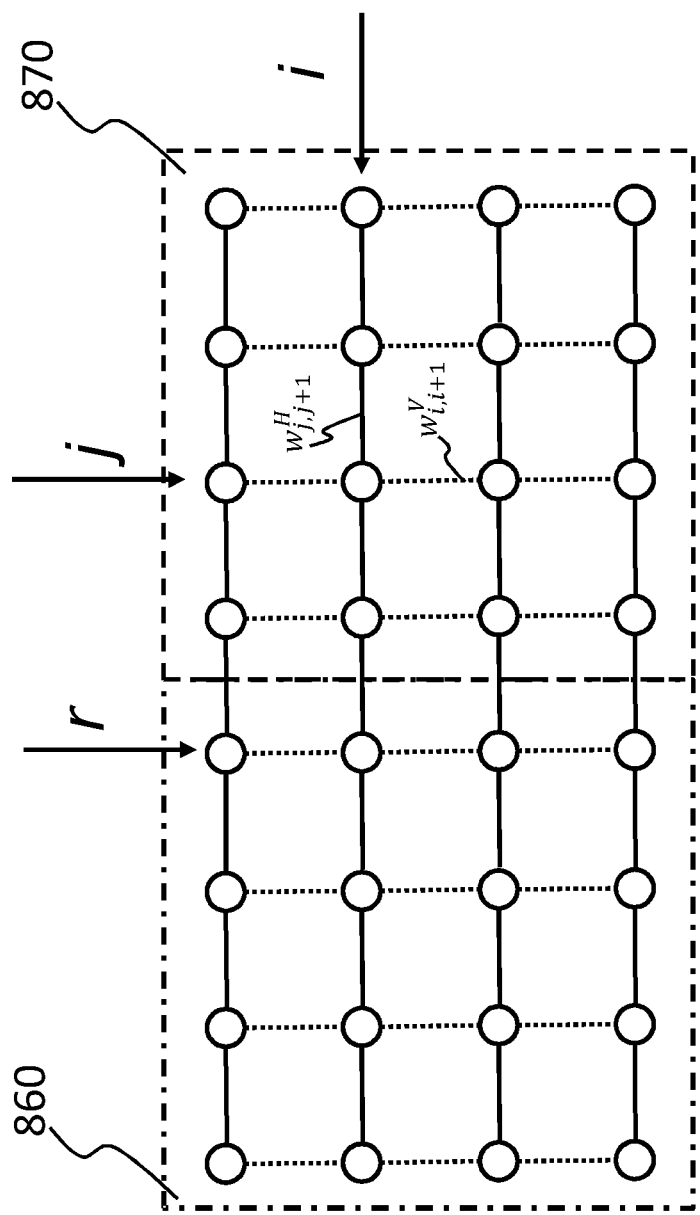
FIG. 10 illustrates the horizontal weights prediction mode, as disclosed in the present invention.

On the other hand, with reference to block 870, the horizontal weights prediction mode takes into account the reconstructed samples related to the adjacent previously coded block 860; in particular, with reference to FIG. 10, the horizontal weights $w_{j,j+1}^H$ for each column $j \in [1,3]$ of the block 870 can be given by $$w_{j,j+1}^H = \rho_j^H; \rho_j^H \in [0,1] \quad (10)$$

whereas the vertical weights $w_{i,i+1}^V$ for each row $i \in [1,3]$ of the block 870 can be predicted considering the set of reconstructed samples $S^H = \{x_{r,1}, x_{r,2}, x_{r,3}, x_{r,4}\}$ of the reference column r in the adjacent previously coded block 830, such as $$w_{i,i+1}^V = f(|x_{i,r} - x_{i+1,r}|). \quad (11)$$

The reconstructed samples x, for both vertical and horizontal weights prediction modes, can be evaluated by performing the inverse graph Fourier transform, according to relation (6) here reminded $$x = (U^T)^{-1} \hat{x}$$

of the de-quantized coefficients $\hat{x} = q\hat{x}^q$ wherein q is the quantization parameter and $\hat{x}^q$ are the quantized coefficients of the adjacent previously coded block 830 or 860.

U is the transform matrix, wherein the columns of U are the eigenvectors of the Laplacian matrix L given by relation (4) as a function of the weights matrix W obtained considering the graph weights of the adjacent previously coded block 830 or 860.

For each block both vertical and horizontal weights prediction modes are performed, except to the blocks on the border of the image, where only the vertical or the horizontal weights prediction mode is allowed.

With also reference to FIG. 3 and FIG. 8, the graph coding unit 720 preferably performs the following steps:

a graph transform computation 315 wherein the Graph Fourier Transform of the blocks of the image is computed; with reference at block 870, its coefficients $\hat{f}$ can be determined from its pixel samples f by means of the following mathematical expression $$\hat{f} = U^T f \quad (12)$$

where the graph transform matrix U is obtained from the eigenvectors of the graph Laplacian matrix L computed according to relation (4), wherein L is function of the predicted weights of the block 870 evaluated according the vertical or the horizontal weights prediction modes, as explained in the above unit 310;

a coefficients quantization 320 wherein the transformed coefficients $\hat{f}$ of each block, given by relation (12), are quantized by using the coefficients quantization parameter q, so that $\hat{f}^q = \text{round}(\hat{f}/q)$.

With also reference to FIG. 3 the unit 725 preferably performs the following step:

a selection mode prediction 325 wherein the vertical or the horizontal prediction mode for each coded block are selected, by choosing among the sets of quantized coefficients $\hat{f}^q$ the prediction mode which produces the highest number of zero coefficients for each block, and signalling the selected weights prediction mode of each block, for example by means a binary file B, by using a predefined binary word for each prediction mode.

For example, considering the vertical and the horizontal prediction modes as discussed in present embodiment, said binary file B can be composed such that each selected block can be signalled through one bit, which indicates the vertical mode as "1" and the horizontal mode as "0", or vice versa. In another, less preferred embodiment the encoder does not produce such a file, which is not read or received by the decoding apparatus, which in such a case needs to effect again the selection mode prediction for selecting the predictor block of the current one.

With also reference to FIG. 3 the unit 730 preferably performs the following step:

an entropy coding 330 wherein, the selected quantized coefficients are arranged in a sequence, according to a predefined order (e.g., raster-scanner order), the same order used in the decoding apparatus 1200, wherein the selected modes information (stored in the binary file) and the selected quantized coefficients of each block are taken as an input to an entropic encoder which can be, for example, a context adaptive binary arithmetic coding (CABAC) based encoder or a context-adaptive variable-length coding CAVLC based encoder.

Summarizing, with also reference to FIG. 7 and FIG. 11, the method for encoding digital images or video streams according to an embodiment of the invention preferably comprises the following phases:

a receiving phase, wherein at least a portion of an image f is received by means of the input unit 1170;

a graph weights prediction (GWP) phase, wherein the vertical and the horizontal weights prediction modes of the graph related to the blocks of the image is performed; in particular, the weights prediction for each block is obtained by taking in to account the reconstructed (de-quantized and inverse-transformed) pixel intensities of the previously coded adjacent block of the image;

a graph transform computation phase, wherein the graph Fourier transform of the blocks of the image or video data is performed; in particular, said graph Fourier transform is first determined as a function of the vertical predicted weights and next is determined as a function of the horizontal predicted weights, obtaining for each block a set of first coefficients related to the vertical prediction mode, and a set of second coefficients related to the horizontal prediction mode;

a coefficients quantization phase, wherein both the set of vertical and horizontal coefficients of the blocks of the image are quantized, according to a predetermined quantization parameter q;

preferably a prediction modes selection phase, wherein for each block the coding modes with the best coding efficiency is selected. Many solutions to coding mode selection are available in the state of the art of image and video coding. In particular, in an embodiment of the invention the vertical and horizontal weight prediction modes can be selected by choosing among the sets of quantized coefficients, the prediction mode which produces the highest number of zero coefficients for each block, and signalling the selected weights prediction mode of each block, for example into a binary file, by using a predefined binary word for each mode.

Other approaches are generally based on rate distortion theory and optimization techniques, e.g., based on minimization of a Lagrangian function;

preferably an entropy coding phase, wherein the binary file which stores the selected mode information, and the set of the selected quantized coefficients, are entropy-coded, for example by using a context adaptive binary arithmetic coding (CABAC) based encoder; wherein the selected quantized coefficients are first arranged in a sequence, according to a predefined order (e.g., raster-scanner order), the same order used in the decoding apparatus 1200.

Finally, the bitstream outputted by the entropic encoder can be transmitted, and/or stored by means of the output unit 1180.

Decoding

Figure 4:
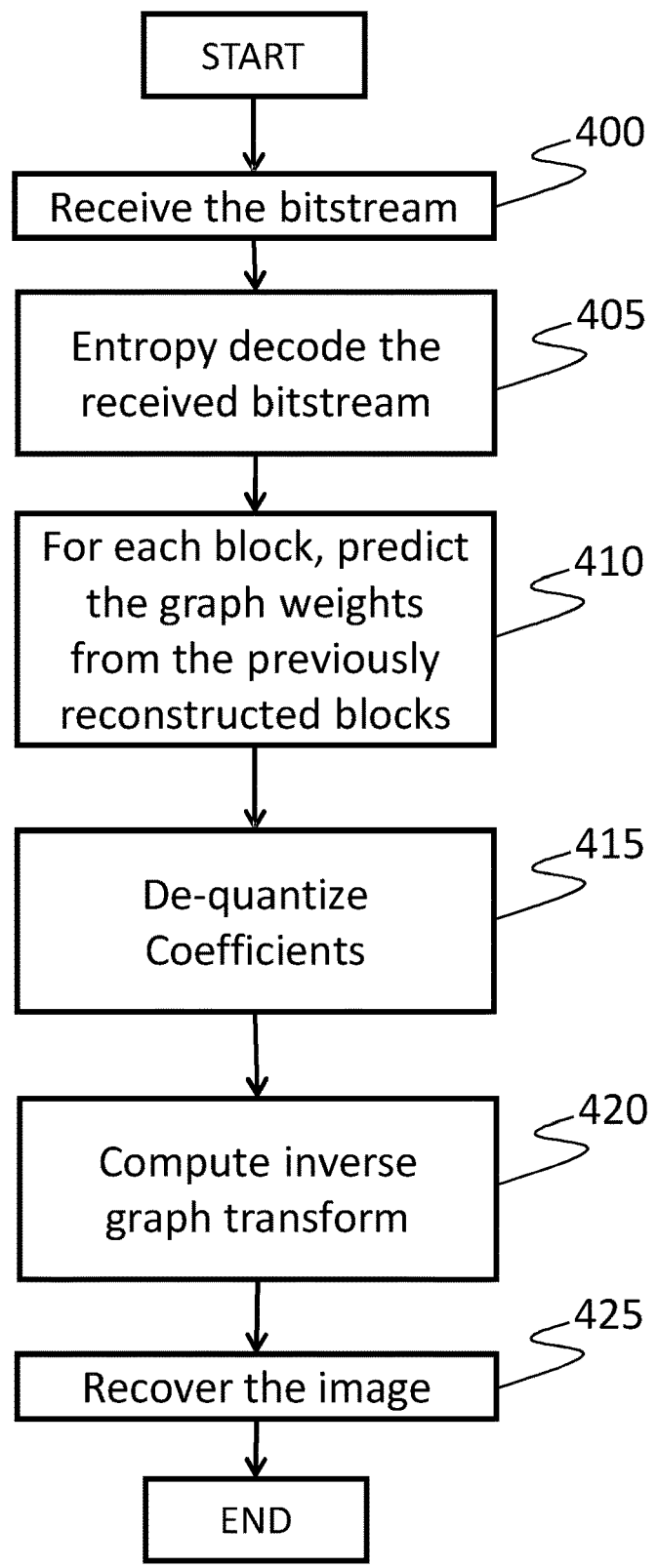
FIG. 4 shows the functioning of the apparatus for decoding digital images or video streams according to the present invention.

With reference to FIG. 7 and FIG. 4, the decoder 750 comprises the entropy decoding unit 755, the graph weights prediction (GWP) unit 760 and the graph decoding unit 765.

The entropy decoding unit 755 preferably performs the following steps:

a receiving step 400 wherein, the bitstream encoded according to the encoding apparatus 1100 is received;

an entropy decoding 405 wherein, the received bitstream is decoded, obtaining an ordered sequence of quantized coefficients $\hat{f}^q$ for each coded block of the image, according to the encoding apparatus 1100, and also decoding the mode prediction information for the blocks of the sequence.

The graph weights prediction unit 760 preferably performs the step 410 wherein, the vertical or horizontal predicted weights of the graph related to the blocks of the sequence is obtained, according to the mode information of the decoded block; in particular, the weights prediction for each block is performed by taking in to account the reconstructed (de-quantized and inverse-transformed) pixel intensities of the previously decoded adjacent block, obtaining the vertical or the horizontal predicted weights related to the graph of the blocks of the sequence.

With reference to the block 870 pictured in FIG. 8, if the prediction mode information received in an embodiment of the invention in form of a binary file B signals that the vertical weights prediction mode has been used by the encoder for the GWP of that block, then the reconstructed coefficients of the adjacent previously decoded block 830 are considered to predict the graph weights of the current block 870.

Whereas, if the prediction mode information signals the horizontal weights prediction mode, then the reconstructed coefficients of the adjacent previously decoded block 860 are considered to predict the graph weights of the current block 870.

The weights are predicted according to relations (7) and (8), for the vertical weights prediction mode, and are predicted according to relations (10) and (11) for the horizontal weights prediction mode.

In the embodiment where no prediction mode information is produced by the encoder 710 or communicated to the decoder 750, the decoder 750 performs a GWP prediction for each applicable block in the same manner followed by the encoder;

The graph decoding unit 760 preferably performs the following steps:

a de-quantizing step 415 wherein, the coefficients of each decoded block are de-quantized according to the quantization parameter q; with reference to the block 870, its quantized coefficients $\hat{f}^q$ are de-quantized such that $\dot{\hat{f}} = q\hat{f}^q$;

an inverse graph transform computation 420, wherein, for each block, the inverse graph Fourier transform of the de-quantized and transformed block coefficients $\dot{\hat{f}}$ is computed, by means of the following mathematical relation $$\hat{f} = U\dot{\hat{f}} \quad (14)$$

where the graph transform matrix U is obtained from the eigenvectors of the graph Laplacian matrix L, which is computed according relation (4), as function of the predicted graph weights of each decoded block, e.g., block 870;

an image recover step 420 wherein, the reconstructed image signal is outputted.

Summarizing, the method for decoding digital images or video streams according to an embodiment of the invention preferably comprises the following phases:

a receiving phase, wherein the bitstream encoded according to the encoding apparatus 1100 is received by means of the input unit 1280;

preferably an entropy decoding phase, wherein the received bitstream is entropy decoded, obtaining an ordered sequence of quantized coefficients of each coded block of the image, according to the encoding apparatus 1100, and also decoding the mode prediction information for the blocks of the sequence;

a graph weights prediction phase, wherein the vertical or the horizontal predicted weights of the graph related to the blocks of the sequence are obtained, according to the mode information of the decoded block.

In particular, the weights prediction for each block is performed by taking into account the reconstructed (de-quantized and inverse-transformed) pixel intensities of the previously decoded adjacent block, obtaining the vertical or the horizontal predicted weights related to the graph of the blocks of the sequence;

a de-quantizing phase, wherein the coefficients of each decoded block are de-quantized according to the quantization parameter q;

an inverse graph transform computation phase, wherein for the blocks of the image, the inverse graph Fourier transform of the de-quantized block coefficients is performed, such that, said inverse graph Fourier transform is determinate in terms of the predicted graph weights of the decoded block;

a recover image phase, wherein each block of the image is obtained by reconstructing the pixels' bi-dimensional matrix of the block, starting from the corresponding vector image f and considering for example a raster scan order, see FIG. 6(*a*). It should be noted that any other order can be considered for this purpose.

Finally, the reconstructed image can be outputted by means of output unit 1270.

Figure 13:
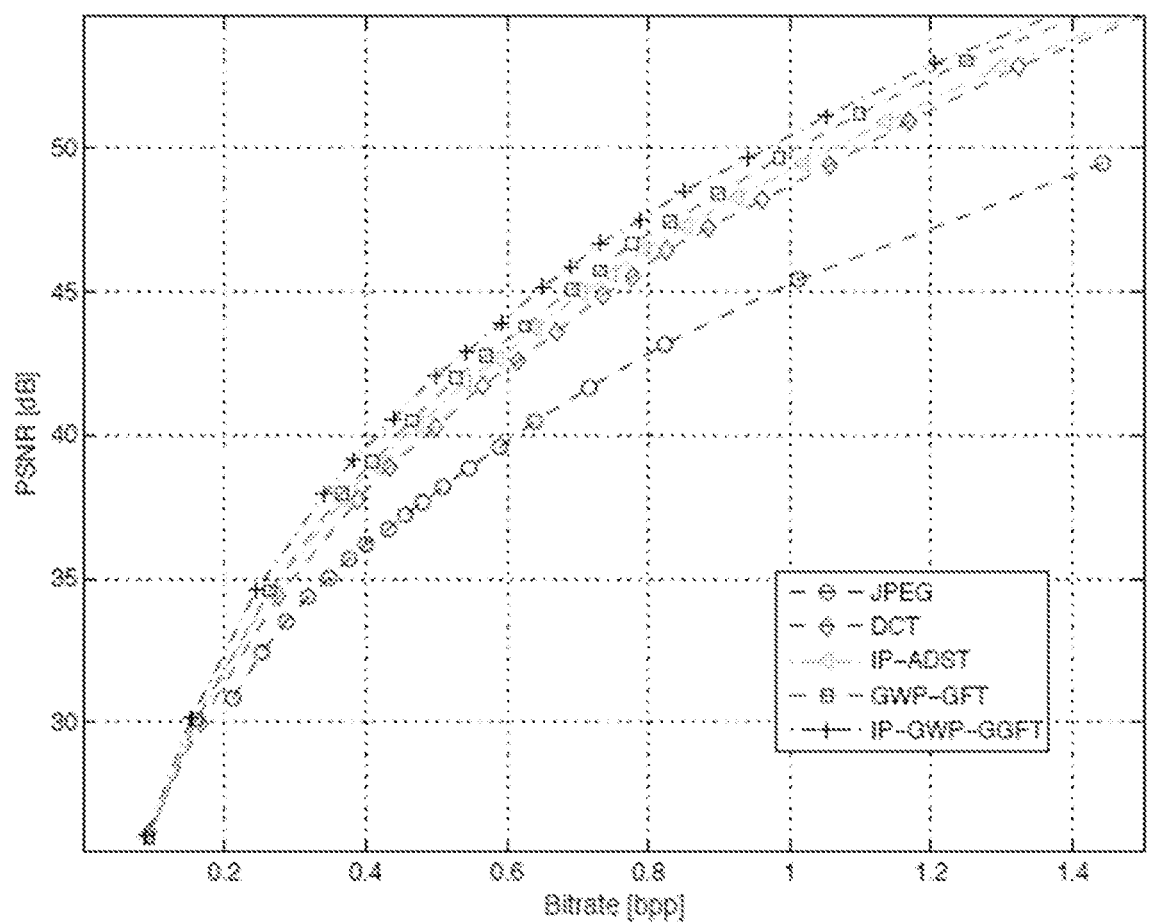
FIG. 13 shows the performance of a test encoder-decoder pair implemented according to the present invention.

With reference to FIG. 13, the results of performance tests conducted by the Applicant are going to be discussed. In this test, an encoder-decoder pair implemented according to the present invention has been evaluated.

All the experiments are worked out on a set of standard images that includes both photographic and computer rendered images, with pixel resolution ranging from 256×256 up to 4288×2848. All color images have been converted to grayscale. The coding gain achievable with GWP has been estimated using the full image codec described in the present invention, whose prototype has been implemented in C++ language.

The coding performance has been measured in terms of PSNR versus coding rate in bit per pixels (bpp) by varying the quantization step q. The block size has been fixed to 8 pixels and graph weights are computed according to (9) with Cauchy function parameter α=6.0.

The comparative study was carried out by using the proposed codec with different prediction modes and transformation variants.

In particular, it is used a standard DCT without prediction on all blocks (that coincides with GFT on uniform 8×8 graph) as a benchmark, then there are added the two proposed vertical and horizontal GWP coding modes (GWP-GFT), as described in the present invention.

Moreover, there is an alternative solution based on three coding modes: classic DCT, vertical and horizontal intra prediction with ADST as proposed by J. Han, A. Saxena, V. Melkote, and K. Rose, in "*Jointly optimized spatial prediction and block transform for video and image coding,*" published in *IEEE Transactions on Image Processing*, vol. 21, April 2012, was compared.

This method will be referred as IP-ADST. Finally, the ADST and GWP were investigated when used jointly by applying the GWP-GGFT on intra prediction residuals, referred as IP-GWP-GGFT.

In FIG. 13 the rate/distortion curves obtained with the experimented methods on the Teapot image are shown. The disclosed vertical and horizontal graph weight prediction modes can be exploited to improve the compaction capacity of the GFT.

Moreover, it is showed that the technique disclosed in the present invention works also in conjunction with common intra prediction modes and other adaptive transforms such as ADST.

The experimental results showed that the technique disclosed in the present invention is able to improve the compression efficiency, providing a BD rate reduction of about 30% over JPEG.

Concluding, the obtained results show that the method described in the present invention can outperform classical fixed transforms as DCT.

The predetermined scan raster order followed for coding and decoding the image blocks is purely exemplificative; it simply reflects the natural order used for scanning a picture.

Other predetermined orders can be used like a vertical scan order where the pixel blocks are scanned by columns starting from the leftmost to the rightmost column, while each blocks column is scanned from the top to the bottom.

In another embodiment a spiraliform scan in a clockwise orientation is used starting from any corner block, like the top leftmost one, and then scanning the first row form left to right, then the last column from top to bottom, then the last row from right to left, then the first column from the bottom to the top up to the second row and so on until the central part of the image is reached like in a clockwise oriented vortex by scanning all the blocks composing the image.

In each of such embodiments the set of blocks previously encoded and decoded with respect to the current one change because the predetermined scan order changes and the invention leads to different sets of candidates for predicting the graph weights of the current block. Another way to scan the image blocks is to follow a zig-zag pattern scan where the blocks are scanned starting from a corner block to the opposite corner block following diagonal paths on the image block grid.

In a preferred embodiment, only one previously encoded and decoded image block is effectively used for performing the GWP; instead two or more of such blocks can be used in any combination for performing the prediction for example by using different prediction weights basing on their vicinity to the current block.

In a preferred embodiment, only one between a horizontal and a vertical prediction mode is chosen for performing the GWP.

In addition, or in alternative, also other adjacent blocks previously reconstructed can be used as candidates for the GWP prediction.

For example, if available, also a diagonal prediction mode can be applied by considering the one or more diagonally adjacent blocks.

In an embodiment using the raster scan order as depicted in FIG. 8, for instance also the diagonally adjacent blocks 820 and 835 can be used together with the horizontal and vertical blocks 830 and 860 as candidates for effecting the GWP of the block 870.

One or more selection criteria are then applied to the enlarged set of prediction candidates and that assuring the best result is chosen as a predictor.

In another embodiment of the present invention, the image to be coded may be preliminarily filtered so to remove high frequency components. Examples of appropriate filters include Gaussian or an anisotropic filter.

In another embodiment, the invention can be adapted so as to be used for compressing also color images.

In case of an RGB image, for example, the invention can be used to compress at least one of the R, G, or B components; since the components are in general strongly correlated it is possible to infer or predict the other components basing on those of the starting one.

Analogously, in case of a YUV coded color image, the luminance component Y can be compressed according to an embodiment of the invention, while the chroma components U and V can be compressed and decompressed in a similar way as their difference signal from Y (Y-U and Y-V), with some adaptations taking into account the different statistical features of the chroma components with respect to luminance.

In another embodiment, the invention is integrated in a video coding technique wherein also the temporal correlation between different images is taken into account. To that end, a prediction mechanism similar to those used in the conventional video compression standards can be used in combination with the invention for effectively compressing and decompressing a video signal.

The terms image and image block used in the present description as input bi-dimensional signal must be interpreted in their broadest meaning.

They can encompass pixel values directly derived or extracted from a natural image, an artificial image, the prediction error of an image, a subsampled version of an image at higher resolution, any portion of said kind of images, or the like.

The vectorising process described for deriving a mono-dimensional vector representation of an image or a portion thereof is merely optional and non-essential for implementing the present invention. It simply allows a compacter representation of the image input data and a simpler data structure and processing of the distances and weights matrixes.

Other kind of representations and data structures can be used for the input image or its blocks and, conversely, for the distance and weight matrixes as well, whose structures, in general depend on those of the input image data.

The dimensions of the image blocks mentioned in describing an embodiment of the invention are exemplificative. In other embodiments, they can be of any size, form a rectangle or a square, be homogeneous for the entire image or adaptive to the local features of the image. For example, the image blocks can be smaller for image areas having more complex edges and larger for those areas having few or no edges.

In another embodiment, others weights prediction modes can be considered in addition to the disclosed vertical and horizontal weights prediction modes. For example, the uniform weights prediction mode, sub-block prediction mode and/or an angular weights prediction mode can be considered.

In the sub-block prediction mode, two or more different prediction techniques can be employed to predict the weights of the graph for the pixels of the considered block. For example, considering a subdivision of the block pixels, a first weights prediction mode can be performed for pixels located in the even rows, whereas a second weights prediction mode can be performed for pixels located in the odd rows.

Figure 14:
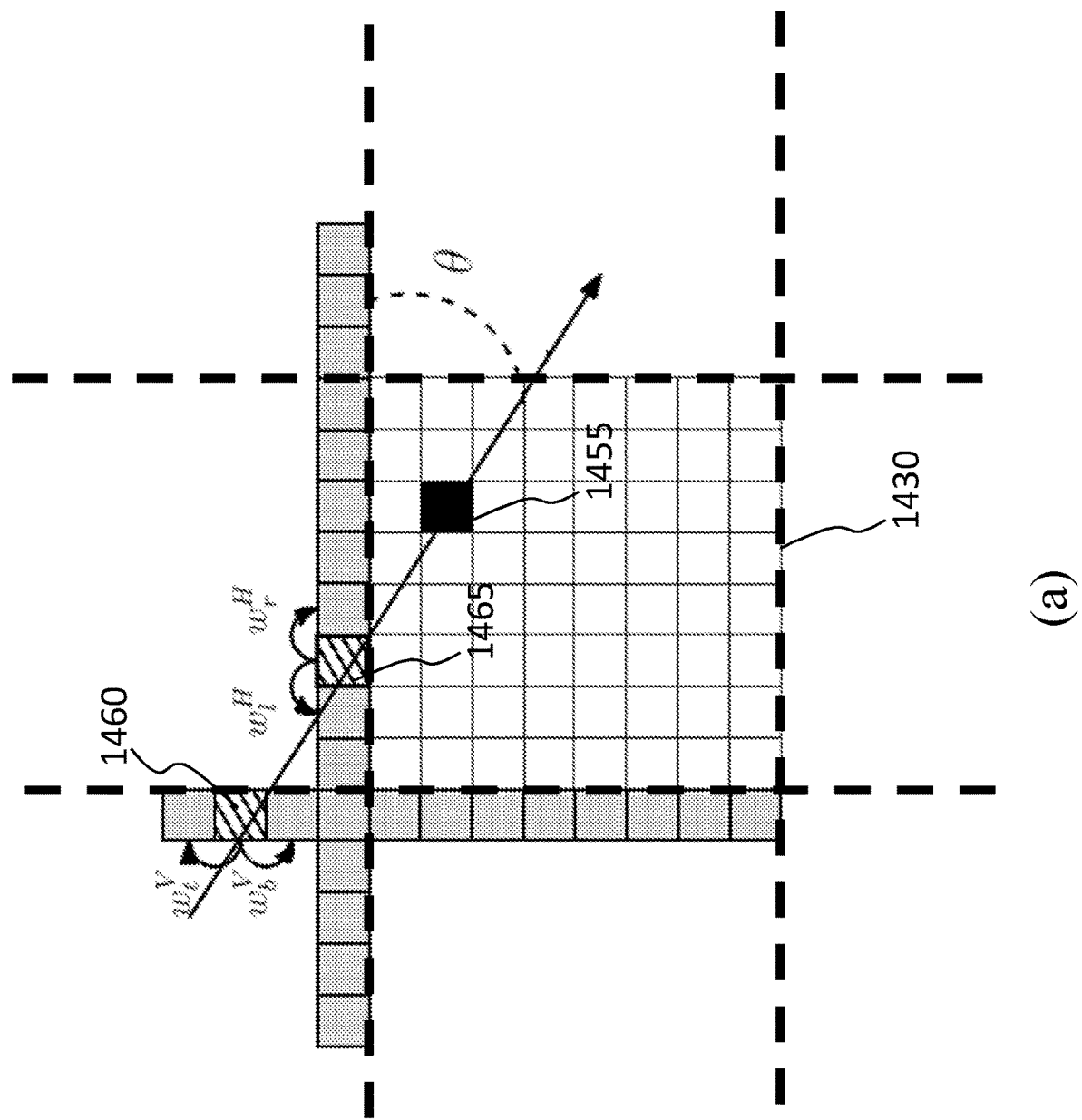
FIG. 14 illustrates the angular weights prediction mode, as disclosed in the present invention.

A possible realization of an angular weights prediction mode can be performed to any angular direction as shown in FIG. 14. In this figure, dashed box 1430 represents an 8×8 pixels block to be transformed with GFT, whereas grey boxes represent the pixels that can be used for weight prediction (pixels on left and top have been already coded and decoded).

It should be noted that in some cases top prediction cannot be enabled, e.g., when coding the first row of block in an image; the same happens for the left-hand side for the first block of each row in the image.

Assuming to predict the graph weight of the pixel 1455 highlighted in solid black at coordinate (2, 6) in the 8×8 pixels block 1430. To this end the prediction direction $\theta \in [0,\pi]$ can be defined, as shown in figure. Given the target pixel and the desired direction it is possible to find the intersection with two already decoded pixels in the grey stripes 1460 and 1465. These two pixels can be used to estimate the vertical and horizontal weights for the target pixel location, see FIG. 14*b*.

In particular, from pixel 1460 one can estimate the vertical weights $w^V_t$ and $w^V_b$, i.e., vertical top and bottom weight respectively. This can be done comparing the predicting pixel in the left stripe with its top and bottom neighbours.

Analogously from pixel 1465 one can estimate the horizontal weights $w^H_l$ and $w^H_r$, for the horizontal left and rights connection in the graph. Clearly, depending on the desired angular direction some predictors on top and on the left may be missing (not yet coded or unavailable).

In such a case weights can be set to a default value, typically equal to 1. It can be noted that setting $\theta=0$ one gets the horizontal weight prediction discussed above whereas $\theta=\pi/2$ corresponds to the vertical weight prediction case.

In a further embodiment, the coefficients f̂ can be quantized according to other quantization schemes, such as vector quantization, trellis coded quantization, etc.

The present description has tackled some of the possible variants, but it will be apparent to the man skilled in the art that other embodiments may also be implemented, wherein some elements may be replaced with other technically equivalent elements. The present invention is not therefore limited to the explanatory examples described herein, but may be subject to many modifications, improvements or replacements of equivalent parts and elements without departing from the basic inventive idea, as set out in the following claims.

The invention claimed is:

1. A method for encoding digital images or video streams based on graph Fourier domain transforms and inverse transforms, wherein image blocks of the digital images or video streams are represented by graph weights matrices, each of which includes weights denoting a level of similarity between pairs of pixel values composing said image blocks, and wherein a graph Fourier domain transform of an image block is determined based on a corresponding graph weights matrix for the image block, said method comprising:
  receiving a portion of an image comprising at least a block of pixel values;
  de-quantizing quantized inverse graph Fourier transformed pixel values of at least one previously encoded image block, which is adjacent to said received block and which is a predictor block, the received block being encoded before a current block according to a coding order predetermined for both an encoder and a decoder;
  inverse graph Fourier transforming said de-quantized graph Fourier transformed pixel values of the predictor block to obtain pixel samples;
  determining weights of a graph weights matrix of the current block, which is a predicted block and which is to be encoded by combining vertical and horizontal weight predictions based on the obtained pixel samples of the predictor block, wherein the predictor block is included in a set of candidate adjacent blocks usable to predict the weights of the graph weights matrix of the current block;
  performing a graph Fourier transform of the weights for the current block to obtain, for said at least one block, a set of frequency coefficients that are determined based on a Laplacian of said weights of the graph weights matrix;
  quantizing and entropy encoding said set of frequency coefficients;
  transmitting and/or storing a bitstream comprising said quantized set of frequency coefficients; and
  omitting to transmit and/or to store the graph weights matrix and/or an edge map based on said graph weights matrix.

2. The encoding method according to claim 1, wherein said at least one previously encoded image block is adjacent to said current block, said at least one previously encoded image block having at least one border pixel contiguous to at least one border pixel of said current block.

3. The encoding method according to claim 1, wherein reconstructed pixel values pertaining to a plurality of predictor blocks are used for predicting said weights of the graph weights matrix.

4. The encoding method according to claim 1, wherein a plurality of graph weights predictions is determined for the current block, and wherein one graph weights prediction out of the plurality of graph weights predictions is selected.

5. The encoding method according to claim 4, wherein said plurality of graph weights predictions comprises the following:
  a vertical prediction using pixel values pertaining to a block adjacent upper to the block, and
  a horizontal prediction mode using pixel values pertaining to a block adjacent left to the block.

6. The encoding method according to claim 4, wherein selecting the one graph weights prediction comprises one of the following:
  selecting the one graph weights prediction by choosing, among the quantized set of frequency coefficients, whichever graph weights prediction produces a highest number of zero coefficients for the block of the image; and
  selecting the one graph weights prediction among an on-rate distortion theory and optimization techniques based on minimization of a Lagrangian function.

7. The encoding method according to claim 4, said method further comprising inserting signalling information indicating the selected one graph weights prediction into said bitstream.

8. A method for decoding digital images or video streams based on graph Fourier domain transforms and inverse transforms, wherein image blocks of the digital images or video streams are represented by graph weights matrices, each of which includes weights denoting a level of similarity between pairs of pixel values composing said image blocks, and wherein a graph Fourier domain transform of an image block is determined based on a corresponding graph weights matrix for the image block, said method comprising:
  receiving an encoded bitstream comprising quantized and graph Fourier transformed coefficients of image blocks of an image without a graph weights matrix and/or without an edge map based on said graph weights matrix;
  de-quantizing quantized inverse graph Fourier transformed pixel values of at least one previously encoded image block, which is a predictor block and which is adjacent to a received image block, wherein the received image block is a predicted block and is encoded before a current block according to a coding order predetermined for both an encoder and a decoder;
  inverse graph Fourier transforming said de-quantized graph Fourier transformed pixel values of the predictor block to obtain pixel samples;

determining weights of a graph weights matrix for the predicted block by combining vertical and/or horizontal weight predictions based on the obtained pixel samples of the predictor block, wherein the predictor block is included in a set of candidate adjacent blocks usable to predict the weights of the graph weights matrix;

de-quantizing the coefficients of the image blocks, including coefficients for the predicted block;

for the image blocks of the image, performing an inverse graph Fourier transform of the de-quantized coefficients, such that, said inverse graph Fourier transform is determined based on a Laplacian of the weights of the graph weights matrix;

obtaining a reconstructed image signal; and outputting and/or storing the reconstructed image.

9. The decoding method according to claim 8, wherein said predictor block is adjacent to said block, said predictor block having at least one border pixel contiguous to at least one border pixel of said block.

10. The decoding method according to claim 8, wherein reconstructed pixel values pertaining to a plurality of predictor blocks are used for predicting the weights of the graph weights matrix.

11. The decoding method according to claim 8, wherein a plurality of graph weights predictions are determined for the block, wherein the plurality of graph weights predictions are prediction modes, and wherein one of said prediction modes is selected.

12. The decoding method according to claim 11, wherein said plurality of graph weights predictions comprises the following:
a vertical prediction using pixel values pertaining to a block adjacent upper to the block, and
a horizontal prediction mode using pixel values pertaining to a block adjacent left to the block.

13. The decoding method according to claim 11, wherein selecting the one prediction mode comprises one of the following:
selecting the one prediction mode by choosing, among the quantized transformed coefficients, whichever prediction mode produces a highest number of zero coefficients for the block; and
selecting the one prediction mode among an on-rate distortion theory and optimization techniques based on minimization of a Lagrangian function.

14. The decoding method according to claim 8, said method further comprising reading signalling information indicating prediction modes used for the block from said received bitstream and using the reading signalling information when predicting the elements of the new weights matrix.

15. An apparatus for encoding digital images or video streams based on graph Fourier domain transforms and inverse transforms, wherein image blocks of the digital images or video streams are represented by graph weights matrices, each of which includes weights denoting a level of similarity between pairs of pixels values composing said image blocks, and wherein a graph Fourier domain transform of an image block is determined based on a corresponding graph weights matrix for the image block, said apparatus comprising:
one or more processors; and
one or more computer-readable hardware storage devices that store instructions that cause the apparatus to at least:
acquire at least a portion of an image from a source, said portion comprising an image block to be encoded;
de-quantize quantized inverse graph Fourier transformed pixel values of at least one previously encoded image block, which is a predictor block and which is adjacent to said acquired image block, the acquired image block being encoded before a current block according to a coding order predetermined for both an encoder and a decoder;
inverse graph Fourier transform said de-quantized graph Fourier transformed pixel values of the predictor block to obtain pixel samples;
determine weights of a graph weights matrix of the current block, which is a predicted block and which is to be encoded by combining vertical and horizontal weight predictions based on the obtained pixel samples of the predictor block, wherein the predictor block of the image is included in a set of candidate adjacent blocks usable to predict the weights of the graph weights matrix;
perform a graph Fourier transform of the weights for the current block to obtain, for said image block, a set of frequency coefficients that are determined based on a Laplacian of said weights of the graph weights matrix;
quantize and entropy encode said coefficients;
obtain, for said image blocks, a set of coefficients determined on a basis of predicted weights of the graph weights matrix; and
output a bitstream comprising said quantized coefficients omitting the graph weights matrix and/or omitting an edge map based on said graph weights matrix.

16. The encoding apparatus according to claim 15, wherein said predictor block is adjacent to said block, said predictor block having at least one border pixel contiguous to at least one border pixel of said block.

17. The encoding apparatus according to claim 15, wherein reconstructed pixel values pertaining to a plurality of predictor blocks are used for predicting the weights.

18. An apparatus for decoding digital images or video streams based on graph Fourier domain transforms and inverse transforms, wherein image blocks of the digital images or video streams are represented by graph weights matrices, each of which includes weights denoting a level of similarity between pairs of pixel values composing said image blocks, and wherein a graph Fourier domain transform of an image block is determined based on a corresponding graph weights matrix for the image block, said apparatus comprising:
one or more processors; and
one or more computer-readable hardware storage devices that store instructions that are executable by the one or more processors to cause the apparatus to at least:
read an encoded bitstream comprising quantized and graph Fourier transformed coefficients of image blocks of an image without a graph weights matrix and/or without an edge map based on said graph weights matrix;
de-quantize quantized inverse graph Fourier transformed pixel values of a least one previously encoded image block, which is a predictor block and which is adjacent to a received image block, wherein the received image block is a predicted block and is encoded before a current block according to a coding order predetermined for both an encoder and a decoder;

inverse graph Fourier transforming said de-quantized graph Fourier transformed pixel values of the predictor block to obtain pixel samples;

determine weights of a graph weights matrix for the predicted block by combining vertical and/or horizontal weight predictions based on the obtained pixel samples of the predictor block, wherein the predictor block is included in a set of candidate adjacent blocks usable to predict the weights of the weights of the graph weights matrix;

de-quantize the coefficients of image blocks, including coefficients for the predicted block;

for the image blocks of the image, perform an inverse graph Fourier transform of the de-quantized coefficients such that said inverse graph Fourier transform is determined based on a Laplacian of predicted graph weights of the graph weights matrix; and recover said image starting from said decoded image blocks and outputting it.

19. The decoding apparatus according to claim 18, wherein said predictor block is adjacent to said block, said predictor block having at least one border pixel contiguous to at least one border pixel of said block.

20. The decoding apparatus according to claim 18, wherein reconstructed pixel values pertaining to a plurality of predictor blocks are used for predicting the weights.

21. One or more non-transitory storage devices that comprise portions of software code for executing the method according to claim 1.

22. The method of claim 1, wherein the method further includes:

performing a preliminary filtering operation on the image, wherein the preliminary filtering operation includes removing selected components from the image, where the selected components are identified as being high frequency components.

\* \* \* \* \*